United States Patent
Yamada

(10) Patent No.: US 11,558,073 B2
(45) Date of Patent: Jan. 17, 2023

(54) SWITCH MODULE

(71) Applicant: Murata Manufacturing Co., Ltd., Nagaokakyo (JP)

(72) Inventor: Takayuki Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 433 days.

(21) Appl. No.: 16/728,046

(22) Filed: Dec. 27, 2019

(65) Prior Publication Data

US 2020/0136659 A1 Apr. 30, 2020

Related U.S. Application Data

(63) Continuation of application No. PCT/JP2018/024064, filed on Jun. 25, 2018.

(30) Foreign Application Priority Data

Jun. 28, 2017 (JP) ............................. JP2017-126282

(51) Int. Cl.
| | |
|---|---|
| *H04B 1/00* | (2006.01) |
| *H03H 9/02* | (2006.01) |
| *H03H 9/25* | (2006.01) |
| *H03H 9/72* | (2006.01) |
| *H04B 1/18* | (2006.01) |

(52) U.S. Cl.
CPC ....... *H04B 1/0057* (2013.01); *H03H 9/02015* (2013.01); *H03H 9/25* (2013.01); *H03H 9/725* (2013.01); *H04B 1/0078* (2013.01); *H04B 1/18* (2013.01)

(58) Field of Classification Search
CPC ...... H04B 1/0057; H04B 1/0078; H04B 1/18; H03H 9/02015; H03H 9/25; H03H 9/725
See application file for complete search history.

(56) References Cited

U.S. PATENT DOCUMENTS

| | | | |
|---|---|---|---|
| 2014/0112213 A1* | 4/2014 | Norholm | H04B 1/56 370/277 |
| 2015/0028963 A1 | 1/2015 | Ebihara et al. | |
| 2016/0164547 A1 | 6/2016 | Kim et al. | |

(Continued)

FOREIGN PATENT DOCUMENTS

| | | |
|---|---|---|
| JP | 2015-023557 A | 2/2015 |
| WO | 2017/073509 A1 | 5/2017 |
| WO | 2017/077852 A1 | 5/2017 |

OTHER PUBLICATIONS

Official Communication issued in International Patent Application No. PCT/JP2018/024064, dated Sep. 18, 2018.

*Primary Examiner* — Samuel S Outten
(74) *Attorney, Agent, or Firm* — Keating & Bennett, LLP

(57) ABSTRACT

A switch module switches among a first state where first and second frequency bands are used in parallel, a second state where only the first frequency band is used, and a third state where none of the first and second frequency bands is used, and includes first, second, and third filters and an antenna switch. In the first state, a common terminal and the first and second filters are connected and the common terminal and the third filter are not connected. In the second state, the common terminal and the first and third filters are connected, and the common terminal and the second filter are not connected.

20 Claims, 25 Drawing Sheets

(56) References Cited

U.S. PATENT DOCUMENTS

2017/0063332 A1\* 3/2017 Gilbert ............... H03H 9/02574
2017/0244432 A1\* 8/2017 Ranta .................... H04W 88/06
2018/0227006 A1 8/2018 Yasuda
2018/0248569 A1 8/2018 Takenaka \* cited by examiner

THIRD CONNECTION STATE

FIRST CONNECTION STATE

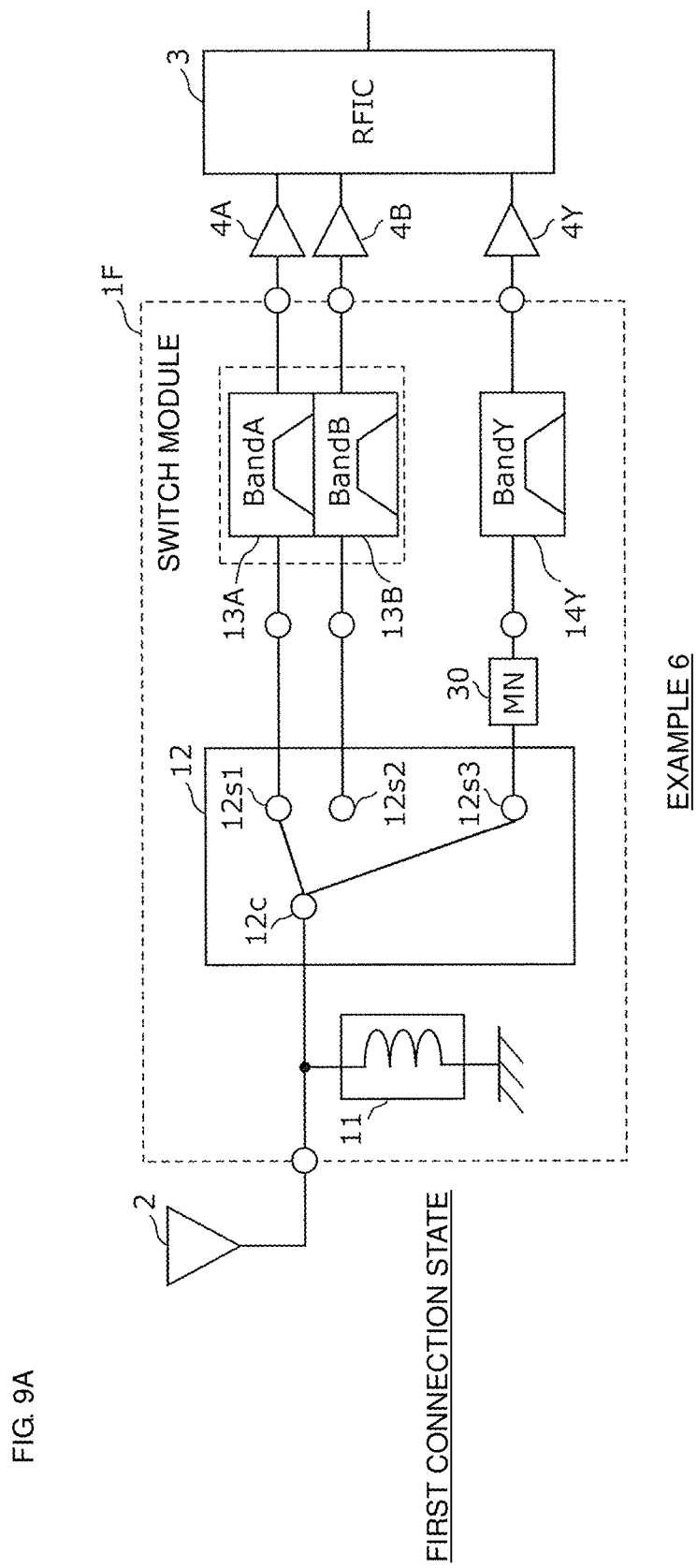

SWITCH MODULE

CROSS REFERENCE TO RELATED APPLICATIONS

This application claims the benefit of priority to Japanese Patent Application No. 2017-126282 filed on Jun. 28, 2017 and is a Continuation Application of PCT Application No. PCT/JP2018/024064 filed on Jun. 25, 2018. The entire contents of each application are hereby incorporated herein by reference.

BACKGROUND OF THE INVENTION

1. Field of the Invention

The present invention relates to a switch module for use in wireless communication.

2. Description of the Related Art

In recent years, cellular phones are required to support multiple frequency bands and multiple wireless modes using one terminal (multiband and multimode support). Front-end circuits that support multiple bands and multiple modes are desired to process a plurality of transmission and reception signals at high speed without degradation of quality even when a carrier aggregation (CA) mode is applied. In the CA mode, a plurality of transmission signals or a plurality of reception signals in different frequency bands are used as one communication signal with the same antenna in parallel.

Japanese Unexamined Patent Application Publication No. 2015-23557 describes an electronic circuit including a switch that selects any one or some of ports A to D to be connected to an antenna, three duplexers connected in association with the ports A to C of the ports A to D, and an inductor with one end connected to the port D and another end that is grounded. When at least one of transmission and reception of each of two duplexers of the three duplexers is performed in parallel, the electronic circuit selects two ports from among the ports A to C of the switch, and the port D. In other words, the two duplexers and the inductor are connected to a common terminal. With this connection configuration, in the pass band of one of the two duplexers, the other one of the two duplexers is disconnected from the switch, whereas, in the pass band of the other one of the two duplexers, the one of the two duplexers is disconnected from the switch. Thus, an electronic circuit that can obtain good frequency characteristics can be provided.

With the electronic circuit described in Japanese Unexamined Patent Application Publication No. 2015-23557, when the two duplexers are used in parallel, the inductor for impedance matching is connected to the switch. On the other hand, when each of the three duplexers is used alone, the inductor is not connected to the switch. In other words, the inductor is a matching circuit element that is required only when two duplexers are used in parallel, and there is inconvenience in that the electronic circuit increases in size by the amount of the inductor added.

SUMMARY OF THE INVENTION

Preferred embodiments of the present invention provide systems that each enable multiple radio-frequency signals in different frequency bands to be used in parallel, and provide small-sized switch modules that each reduce or prevent an increase in propagation loss of a radio-frequency signal even when a selected frequency band to be used changes.

A switch module according to a preferred embodiment of the present invention is able to switch among (1) a first state where a radio-frequency signal of a first frequency band and a radio-frequency signal of a second frequency band different in frequency band from the first frequency band are propagated in parallel, (2) a second state where, of a radio-frequency signal of the first frequency band and a radio-frequency signal of the second frequency band, only a radio-frequency signal of the first frequency band is propagated, and (3) a third state where a radio-frequency signal of the first frequency band and a radio-frequency signal of the second frequency band are not propagated and a radio-frequency signal of a third frequency band different in frequency band from the first frequency band or the second frequency band is propagated. The switch module includes a first filter circuit to selectively pass a radio-frequency signal of the first frequency band, a second filter circuit to selectively pass a radio-frequency signal of the second frequency band, a third filter circuit to selectively pass a radio-frequency signal of the third frequency band, and a switch circuit. The switch circuit includes a common terminal, a first selection terminal connected to one end of the first filter circuit, a second selection terminal connected to one end of the second filter circuit, and a third selection terminal connected to one end of the third filter circuit. The switch circuit is structured to switch connection of at least one of the first selection terminal, the second selection terminal, and the third selection terminal with the common terminal. In the first state, the common terminal and the first selection terminal are connected, the common terminal and the second selection terminal are connected, and the common terminal and the third selection terminal are not connected. In the second state, the common terminal and the first selection terminal are connected, the common terminal and the second selection terminal are not connected, and the common terminal and the third selection terminal are connected.

With this configuration, in a single band mode in which, of the first frequency band and the second frequency band, only the first frequency band is used, not only the first filter circuit but also the third filter circuit is connected to the common terminal. Therefore, an impedance in the first frequency band of the first filter circuit in the single band mode is equalized or substantially equalized (brought close) to an impedance in a dual band mode in which both the first frequency band and the second frequency band are used. Thus, even when the connection status of the switch circuit is changed, a change in impedance at the common terminal is reduced, such that the degradation of insertion loss and return loss in a pass band of the first filter circuit is reduced or prevented.

In the second state, the third filter circuit that is used in the third state is used, such that no impedance matching circuit element in the first state or the second state is additionally required. Thus, space saving (miniaturization) is achieved.

An impedance in the first frequency band when the third filter circuit alone is viewed from the one end of the third filter circuit may be equal or substantially equal to an impedance in the first frequency band when the second filter circuit alone is viewed from the one end of the second filter circuit.

With this configuration, an impedance in the first frequency band of the first filter circuit, viewed from the common terminal, is able to be equalized or substantially equalized between the first state and the second state. Thus, an insertion loss in the first frequency band of the first filter circuit is reduced regardless of whether the connection status is the first state or the second state.

The switch module may further include an impedance matching circuit connected to a signal path connecting the third filter circuit and the third selection terminal, and the impedance matching circuit may be structured to match an impedance in the first frequency band when the third filter circuit alone is viewed from the third selection terminal with an impedance in the first frequency band when the second filter circuit alone is viewed from the one end of the second filter circuit.

With this configuration, an impedance in the first frequency band of the third filter circuit alone, viewed from the third selection terminal, is able to be shifted. Thus, even when an impedance in the first frequency band of the third filter circuit alone and an impedance in the first frequency band of the second filter circuit alone do not match each other, a change in impedance at the common terminal with a change between the first state and the second state is able to be reduced with high accuracy, such that the degradation of insertion loss and return loss in the pass band of the first filter circuit is able to be reduced with high accuracy.

The impedance matching circuit may include a capacitor connected between the signal path and a ground.

With this configuration, an impedance in the first frequency band of the third filter circuit alone, viewed from the third selection terminal, is able to be shifted in a clockwise direction along a constant conductance circle. Thus, even when an impedance in the first frequency band of the third filter circuit alone and an impedance in the first frequency band of the second filter circuit alone do not match each other, a change in impedance at the common terminal with a change between the first state and the second state is able to be reduced with high accuracy, so the degradation of insertion loss and return loss in the pass band of the first filter circuit is able to be reduced with high accuracy.

The impedance matching circuit may include an inductor connected between the one end of the third filter circuit and the third selection terminal.

With this configuration, an impedance in the first frequency band of the third filter circuit alone, viewed from the third selection terminal, is able to be shifted in a clockwise direction along a constant resistance circle. Thus, even when an impedance in the first frequency band of the third filter circuit alone and an impedance in the first frequency band of the second filter circuit alone do not match each other, a change in impedance at the common terminal with a change between the first state and the second state is able to be reduced with high accuracy, so the degradation of insertion loss and return loss in the pass band of the first filter circuit is able to be reduced with high accuracy.

The third filter circuit may be a surface acoustic wave resonator that uses leaky waves that propagate in a piezoelectric layer made of $LiTaO_3$, and the third frequency band may be located at frequencies higher than the first frequency band.

The third filter circuit that uses leaky waves that propagate in a piezoelectric layer made of $LiTaO_3$ has characteristics such that a reflection coefficient in a lower frequency range than the pass band is greater than a reflection coefficient in a higher frequency range than the pass band. Therefore, by adjusting the lower frequency range of the third filter circuit to the first frequency band, an insertion loss in the first frequency band of the first filter circuit in the second state is further reduced.

The third filter circuit may be a surface acoustic wave resonator that uses Rayleigh waves that propagate in a piezoelectric layer made of $LiNbO_3$ or an acoustic wave resonator (bulk acoustic wave resonator) that uses bulk waves.

The third filter circuit that is a surface acoustic wave resonator that uses Rayleigh waves that propagate in a piezoelectric layer made of $LiNbO_3$ or an acoustic wave resonator that uses bulk waves has characteristics such that a reflection coefficient is large in both the higher frequency range and lower frequency range than the pass band. Therefore, by adjusting the stop band of the third filter circuit to the first frequency band, an insertion loss in the first frequency band of the first filter circuit in the second state is further reduced.

A capacitance in the first frequency band when the third filter circuit alone is viewed from the one end of the third filter circuit may be equal or substantially equal to a capacitance in the first frequency band when the second filter circuit alone is viewed from the one end of the second filter circuit.

An acoustic wave resonator that uses leaky waves that propagate in a piezoelectric layer made of $LiTaO_3$, a surface acoustic wave resonator that uses Rayleigh waves that propagate in a piezoelectric layer made of $LiNbO_3$, and an acoustic wave resonator that uses bulk waves have a capacitive impedance from their structures. Thus, when a capacitance in the first frequency band of the first filter circuit in the single band mode is equalized or substantially equalized (brought close) to a capacitance in the dual band mode in which both the first frequency band and the second frequency band are used, the impedances are able to be equalized or substantially equalized (brought close) to each other. Thus, an insertion loss in the first frequency band of the first filter circuit is reduced regardless of the first state or the second state.

The switch module may further include a switch controller to receive selection information of a frequency band to be used for wireless communication and output a control signal based on the selection information to the switch circuit. The switch controller may be configured or programmed to, by outputting the control signal to the switch circuit, in the first state, cause the common terminal and the first selection terminal to be connected, cause the common terminal and the second selection terminal to be connected, and cause the common terminal and the third selection terminal to be disconnected, and, in the second state, cause the common terminal and the first selection terminal to be connected, cause the common terminal and the second selection terminal to be disconnected, and cause the common terminal and the third selection terminal to be connected.

With this configuration, the switch controller of the switch module receives selection information of a frequency band to be used for wireless communication from an external device to switch the switch circuit, such that high-speed switching resulting from higher functionality of the switch module and shortened transmission wires for a control signal is possible.

The first state may be a carrier aggregation (CA) mode, and the second state may be a non-carrier aggregation (non-CA) mode.

With this configuration, in operation of carrier aggregation in which the electric power of a signal to be transmitted is relatively large, even when any one of the CA mode and the non-CA mode is selected, a propagation loss of a signal is able to be reduced, so reflection of a signal due to mismatching of impedance is able to be reduced.

The first filter circuit may be a first duplexer including a first transmission filter to transmit a signal of the first frequency band and a first receiving filter to receive a signal of the first frequency band, the second filter circuit may be a second duplexer including a second transmission filter to transmit a signal of the second frequency band and a second receiving filter to receive a signal of the second frequency band, and the third filter circuit may be a third duplexer including a third transmission filter to transmit a signal of the third frequency band and a third receiving filter to receive a signal of the third frequency band.

With this configuration, even when the connection status of the switch circuit is changed, a change in impedance at the common terminal is able to be reduced, so the degradation of insertion loss and return loss in each of the transmission band and receiving band of the first duplexer is reduced or prevented.

A switch module according to a preferred embodiment of the present invention is able to switch among a first state where a radio-frequency signal of a first frequency band, a radio-frequency signal of a second frequency band different in frequency band from the first frequency band, and a radio-frequency signal of a third frequency band different in frequency band from the first frequency band or the second frequency band are propagated in parallel, a second state where, of the first frequency band, the second frequency band, and the third frequency band, only a radio-frequency signal of the second frequency band and a radio-frequency signal of the third frequency band are propagated in parallel, a third state where, of the first frequency band, the second frequency band, and the third frequency band, only a radio-frequency signal of the first frequency band and a radio-frequency signal of the third frequency band are propagated in parallel, a fourth state where, of the first frequency band, the second frequency band, and the third frequency band, only a radio-frequency signal of the third frequency band is propagated, a fifth state where a radio-frequency signal of the first frequency band, a radio-frequency signal of the second frequency band, and a radio-frequency signal of the third frequency band are not propagated and a radio-frequency signal of a fourth frequency band different in frequency band from the first frequency band, the second frequency band, or the third frequency band is propagated, and a sixth state where a radio-frequency signal of the first frequency band, a radio-frequency signal of the second frequency band, and a radio-frequency signal of the third frequency band are not propagated and a radio-frequency signal of a fifth frequency band different in frequency band from the first frequency band, the second frequency band, the third frequency band, or the fourth frequency band is propagated. The switch module includes a first filter circuit to selectively pass a radio-frequency signal of the first frequency band, a second filter circuit to selectively pass a radio-frequency signal of the second frequency band, a third filter circuit to selectively pass a radio-frequency signal of the third frequency band, a fourth filter circuit to selectively pass a radio-frequency signal of the fourth frequency band, a fifth filter circuit to selectively pass a radio-frequency signal of the fifth frequency band, and a switch circuit. The switch circuit includes a common terminal, a first selection terminal connected to one end of the first filter circuit, a second selection terminal connected to one end of the second filter circuit, a third selection terminal connected to one end of the third filter circuit, a fourth selection terminal connected to one end of the fourth filter circuit, and a fifth selection terminal connected to one end of the fifth filter circuit. The switch circuit is structured to switch connection of at least one of the first selection terminal, the second selection terminal, the third selection terminal, the fourth selection terminal, and the fifth selection terminal with the common terminal.

With this configuration, in the first state to the fourth state, even when the connection status of the switch circuit is changed, a change in impedance at the common terminal is reduced, such that the degradation of insertion loss and return loss in the pass band of each of the first filter circuit to third filter circuit is reduced or prevented.

In the second state to the fourth state, the fourth filter circuit that is used in the fifth state and the fifth filter circuit that is used in the sixth state are used, such that no impedance matching circuit element in any of the first state to the fourth state is additionally required. Thus, space saving and miniaturization are possible.

According to preferred embodiments of the present invention, in each of systems that enable multiple radio-frequency signals in different frequency bands to be used in parallel, a small-sized switch module that is able to reduce an increase in the propagation loss of a radio-frequency signal is able to be provided even when a selected frequency band to be used changes.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9A is a circuit configuration diagram in a first connection state of a switch module according to an Example 6 of a preferred embodiment of the present invention.

DETAILED DESCRIPTION OF THE PREFERRED EMBODIMENTS

Figure 1A:
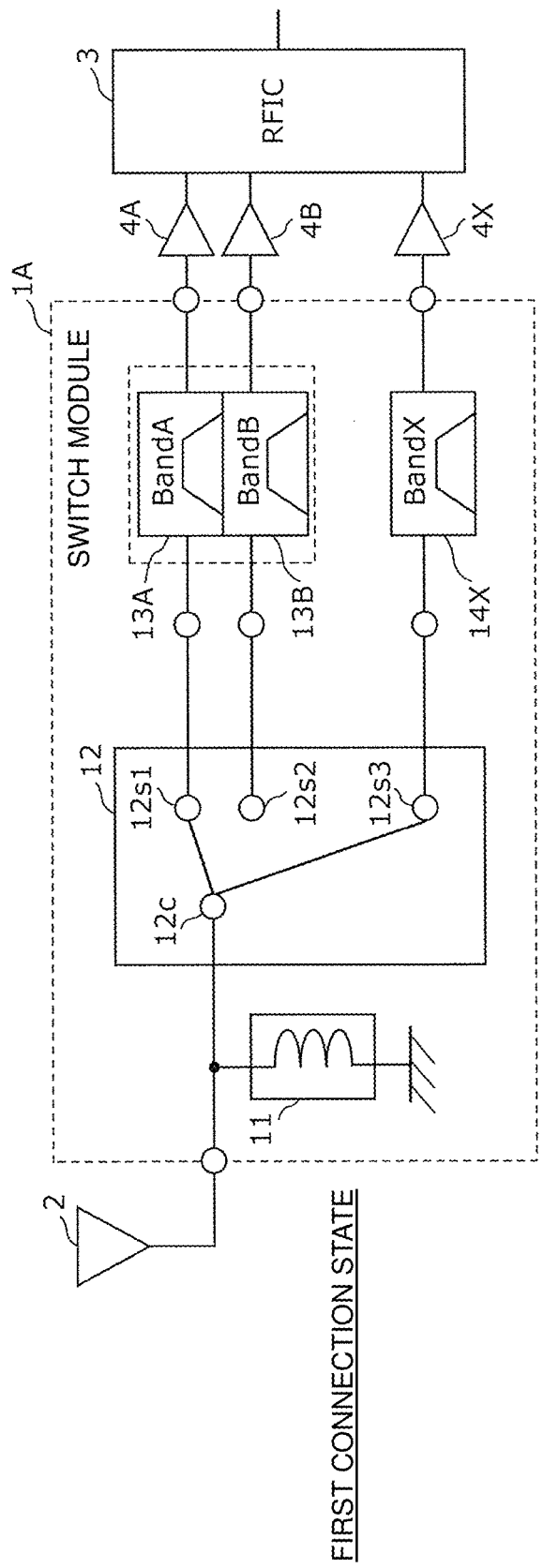
FIG. 1A is a circuit configuration diagram in a first connection state of a switch module according to an Example 1 of a preferred embodiment of the present invention.

Hereinafter, preferred embodiments of the present invention will be described in detail with reference to Examples and the drawings. Examples that will be described below are general or specific examples. Numeric values, shapes, materials, elements, disposition and connection structures and configurations of the elements, and the like, that will be described in the following Examples are illustrative, and are not intended to limit the present invention. Of the elements in the following Examples, the elements not included in the independent claims will be described as optional elements. In addition, the size or size ratio of elements shown in the drawings is not necessarily strict.

PREFERRED EMBODIMENT

1. Circuit Configuration of Switch Module 1A According to Example 1

Figure 1B:
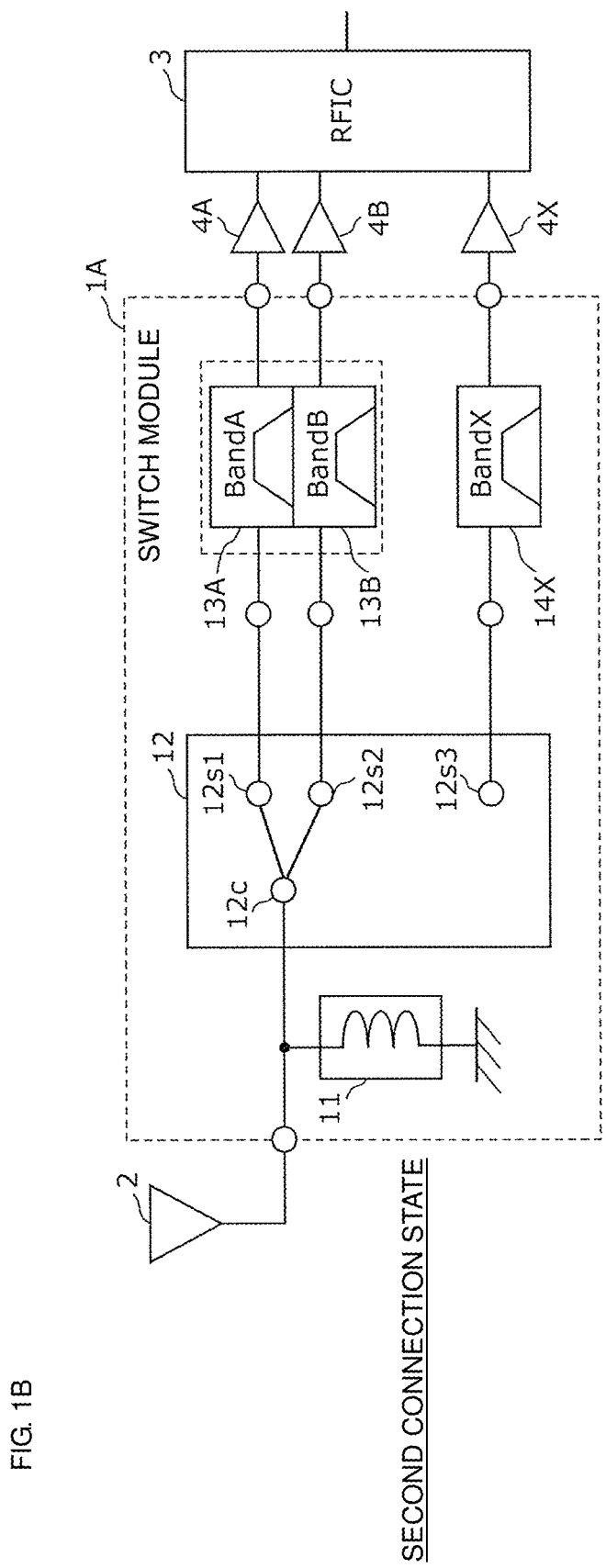
FIG. 1B is a circuit configuration diagram in a second connection state of the switch module according to the Example 1 of a preferred embodiment of the present invention.

FIG. 1A is a circuit configuration diagram in a first connection state of the switch module according to an Example 1 of a preferred embodiment of the present invention. FIG. 1B is a circuit configuration diagram in a second connection state of the switch module according to the Example 1. FIGS. 1A and 1B show the switch module 1A according to the Example 1, an antenna element 2, reception signal amplifier circuits 4A, 4B, 4X, and an RF signal processing circuit (RFIC: radio frequency integrated circuit) 3. The switch module 1A, the antenna element 2, and the reception signal amplifier circuits 4A, 4B, 4X are disposed in, for example, a front-end portion of a cellular phone that supports multiband/multimode functionality.

The switch module 1A is disposed between the antenna element 2 and the reception signal amplifier circuits 4A, 4B, 4X in a wireless communication system that supports multiband/multimode functionality. The switch module 1A is preferably a radio-frequency switch module that switches connection of the antenna element 2 with a signal path that propagates a reception signal(s) in one or more frequency bands selected from among multiple frequency bands. The switch module 1A includes a plurality of signal paths to receive wireless signals as carrier waves in multiple frequency bands to support multimode/multiband functionality. In addition, the switch module 1A is a circuit to, when a wireless signal(s) is/are received in carrier aggregation (CA) mode or non-CA mode, switch a signal path(s) to achieve optimal bandpass characteristics for a radio-frequency reception signal(s).

The switch module 1A includes an antenna matching circuit 11, an antenna switch 12, and filters 13A, 13B, 14X.

The filter 13A is a first filter circuit that selectively passes a radio-frequency (RF) reception signal of a first frequency band (Band A in FIGS. 1A and 1B). For example, Band 1 (receiving band: about 2110 MHz to about 2170 MHz) of LTE (Long Term Evolution) is illustrated as the first frequency band.

The filter 13B is a second filter circuit that selectively passes an RF reception signal of a second frequency band (Band B in FIGS. 1A and 1B) different in frequency band from the first frequency band. For example, (receiving band: about 1805 MHz to about 1880 MHz) of LTE is illustrated Band 3 as the second frequency band. In this Example, the second frequency band is at frequencies lower than the first frequency band.

The filter 14X is a third filter circuit that selectively passes an RF signal of a third frequency band (Band X in FIGS. 1A and 1B) different in frequency band from the first frequency band or the second frequency band. For example, Band 30 (receiving band: about 2350 MHz to about 2360 MHz) of LTE is illustrated as the third frequency band. In this Example, the third frequency band is at frequencies higher than the first frequency band or the second frequency band.

The antenna switch 12 is a switch circuit including a common terminal 12c connected to the antenna element 2, a selection terminal 12s1 (first selection terminal) connected to one end of the filter 13A, a selection terminal 12s2 (second selection terminal) connected to one end of the filter 13B, and a selection terminal 12s3 (third selection terminal) connected to one end of the filter 14X. With the above configuration, the antenna switch 12 switches connection of the common terminal 12c with at least one of the selection terminals 12s1, 12s2, 12s3.

The antenna matching circuit 11 performs impedance matching between the antenna element 2 and the antenna switch 12. In this Example, the antenna matching circuit 11 preferably includes an inductor, for example, connected to a ground and a connection path between the antenna element 2 and the antenna switch 12. The antenna matching circuit 11 does not necessarily include an inductor. The antenna matching circuit 11 preferably is a circuit including a capacitor and an inductor, for example.

The reception signal amplifier circuit 4A is a low-noise amplifier that amplifies the electric power of a radio-frequency reception signal of the first frequency band (Band A). The reception signal amplifier circuit 4B is a low-noise amplifier that amplifies the electric power of a radio-frequency reception signal of the second frequency band (Band B). The reception signal amplifier circuit 4X is a low-noise amplifier that amplifies the electric power of a radio-frequency reception signal of the third frequency band (Band X).

The RF signal processing circuit 3 processes a radio-frequency signal that is transmitted or received by the antenna element 2. Specifically, preferably, the RF signal processing circuit 3 processes a radio-frequency signal (here, radio-frequency reception signal) input from the antenna element 2 by down conversion, or the like, and outputs the processed and generated reception signal to a baseband signal processing circuit (BBIC). The RF signal processing circuit 3 also preferably processes a transmission signal input from the baseband signal processing circuit (BBIC) by up conversion, or the like, and outputs the processed and generated radio-frequency signal (here, radio-frequency transmission signal) to the transmission signal path.

With the above circuit configuration, the switch module 1A according to this Example is able to switch among at least (1) a first state (CA mode) where a radio-frequency signal of the first frequency band and a radio-frequency signal of the second frequency band are propagated in parallel, (2) a second state (non-CA mode) where, of a radio-frequency signal of the first frequency band and a radio-frequency signal of the second frequency band, only the radio-frequency signal of the first frequency band is propagated, and (3) a third state where a radio-frequency signal of the first frequency band and a radio-frequency signal of the second frequency band are not propagated and a radio-frequency signal of the third frequency band is propagated.

The first connection state of the switch module 1A, shown in FIG. 1A, is the second state, and corresponds to the non-CA mode in which only a single frequency band is selected. More specifically, the first connection state (second state: non-CA mode) is a state where the common terminal 12c and the selection terminal 12s1 are connected, the common terminal 12c and the selection terminal 12s2 are not connected, and the common terminal 12c and the selection terminal 12s3 are connected.

The second connection state of the switch module 1A, shown in FIG. 1B, is the first state, and corresponds to the CA mode in which an RF reception signal of the first frequency band and an RF reception signal of the second frequency band are propagated in parallel. More specifically, the second connection state (first state: CA mode) is a state where the common terminal 12c and the selection terminal 12s1 are connected, the common terminal 12c and the selection terminal 12s2 are connected, and the common terminal 12c and the selection terminal 12s3 are not connected.

An impedance in the first frequency band when the filter 14X alone is viewed from one end (input terminal) of the filter 14X is equal or substantially equal to an impedance in the first frequency band when the filter 13B is viewed from one end (input terminal) of the filter 13B.

With this configuration, in the first connection state (second state: non-CA mode), not only the filter 13A but also the filter 14X is connected to the common terminal 12c. Therefore, an impedance in the first frequency band of the filter 13A in the first connection state (second state: non-CA mode) can be equalized or substantially equalized to (brought close to) an impedance in the first frequency band of the filter 13A in the second connection state (first state: CA mode). Thus, even when the connection status of the antenna switch 12 is changed between the first connection state and the second connection state, a change in impedance at the common terminal 12c is reduced or prevented. Therefore, the degradation of insertion loss and return loss in the pass band of the filter 13A is reduced or prevented.

In the first connection state (second state: non-CA mode), the filter 14X that is used in the third state is used, such that no impedance matching circuit element in the first state or the second state is additionally required. Thus, space saving and miniaturization of the switch module 1A are possible.

In this Example, the filter 14X is preferably, for example, a surface acoustic wave resonator that uses leaky waves that propagate in a piezoelectric layer made of $LiTaO_3$. The third frequency band is at frequencies higher than the first frequency band. The filter 14X that uses leaky waves that propagate in a piezoelectric layer made of $LiTaO_3$ has characteristics such that a reflection coefficient in a lower frequency range than the pass band (third frequency band) is greater than a reflection coefficient in a higher frequency range than the pass band (a quality factor in a lower frequency range than the pass band is higher than a quality factor in a higher frequency range than the pass band). Therefore, by adjusting the lower frequency range of the filter 14X to the first frequency band, an insertion loss in the first frequency band of the filter 13A in the first connection state (second state: non-CA mode) is reduced or prevented.

A capacitance in the first frequency band when the filter 14X alone is viewed from one end (input terminal) of the filter 14X is equal or substantially equal to a capacitance in the first frequency band when the filter 13B alone is viewed from one end (input terminal) of the filter 13B.

A surface acoustic wave resonator that uses leaky waves that propagate in a piezoelectric layer made of $LiTaO_3$ has a capacitive impedance due to its structure. Therefore, impedances are equalized or substantially equalized (brought close to each other) by equalizing or substantially equalizing (bringing) a capacitance in the first frequency band of the filter 13A in the first connection state (second state: non-CA mode) to a capacitance in the second connection state (first state: CA mode). Thus, an insertion loss in the first frequency band of the filter 13A is reduced regardless of whether the connection status is the first state or the second state.

In the second state (non-CA mode) where only the first frequency band is selected, the filter 14X connected to the selection terminal 12s3 is connected to the common terminal 12c instead of the filter 13B that is not selected. Therefore, the bandpass characteristics of an RF signal in the second state (non-CA mode) can be equalized or substantially equalized to the bandpass characteristics of an RF signal in the CA mode in which both the first frequency band and the second frequency band are selected, without the addition of any unnecessary inductance component or capacitive component. Thus, in a system that is able to select one of the CA mode and the non-CA mode, even when any mode is selected, a propagation loss of a signal is reduced or prevented.

For example, in a system in which the first frequency band is Band 1 and the second frequency band is Band 3, the filter 14X having a capacitance in the first frequency band equal or substantially equal to an equivalent capacitance in the first frequency band of the filter 13B just needs to be disposed such that a complex impedance when a filter circuit side is viewed from the common terminal 12c in a non-CA mode in which only Band 1 is selected is equal or substantially equal to a complex impedance when a filter circuit side is viewed from the common terminal 12c in a CA mode in which both Band 1 and Band 3 are selected. In this Example, the case where only the first frequency band is selected as a non-CA mode is illustrated. However, the switch module 1A according to this Example is also applicable to a system in which only the second frequency band is selected as a non-CA mode. In the case of the non-CA mode in which only the second frequency band is selected, the filter 14X having an equivalent capacitance value in the second frequency band equal or substantially equal to an equivalent capacitance value in the second frequency band of the filter 13A just needs to be disposed.

The switch module 1A according to this Example may preferably include a switch controller that receives selection information as to whether the first frequency band or the second frequency band is to be used for wireless communication and that outputs a control signal based on the selection information to the antenna switch 12. In this case, when the switch controller outputs a control signal to the antenna switch 12 to select only any one of the first frequency band and the second frequency band, the switch controller connects the common terminal 12c to only one of the selection terminals 12s1, 12s2 and connects the common terminal 12c to the selection terminal 12s3. Thus, the switch controller of the switch module 1A switches the antenna switch 12 upon reception of the selection information from an external device, such that high-speed switching resulting from higher functionality of the switch module 1A and shortened transmission wires for a control signal are possible.

Alternatively, the switch controller need not be included in the switch module 1A and may be included in the RF signal processing circuit 3 or the baseband signal processing circuit connected in a stage subsequent to the RF signal processing circuit 3.

2. Circuit Configuration of Switch Module 50 According to a Comparative Example

Figure 2A:
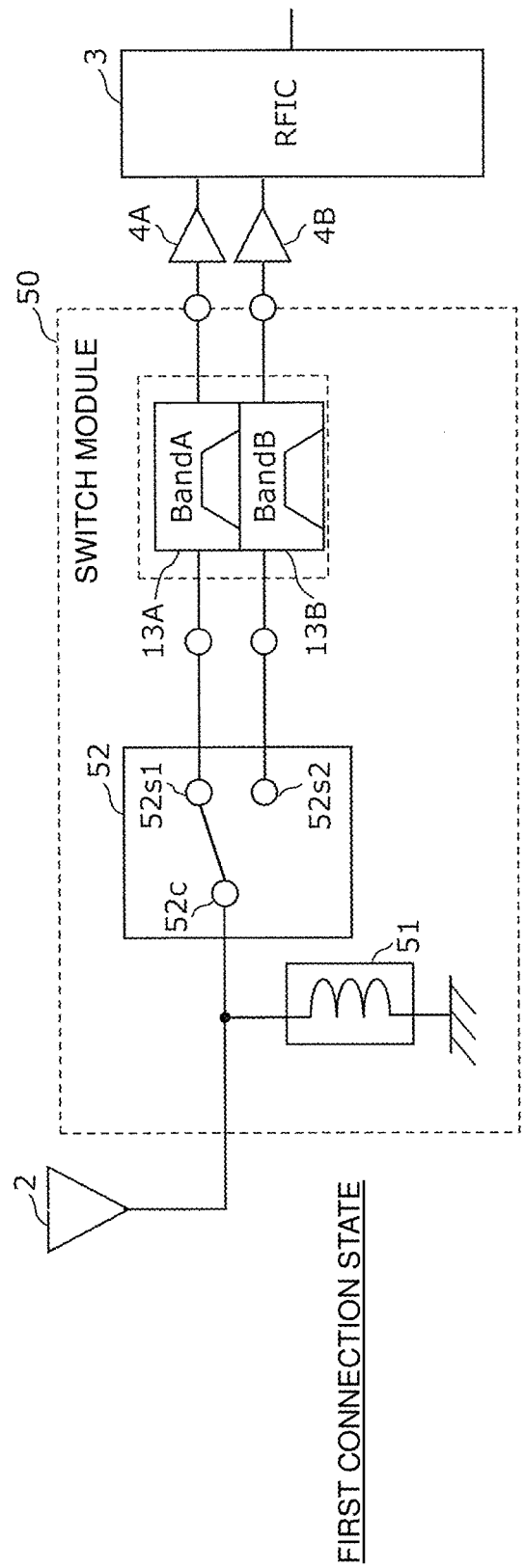
FIG. 2A is a circuit configuration diagram in a first connection state of a switch module according to a Comparative Example.
Figure 2B:
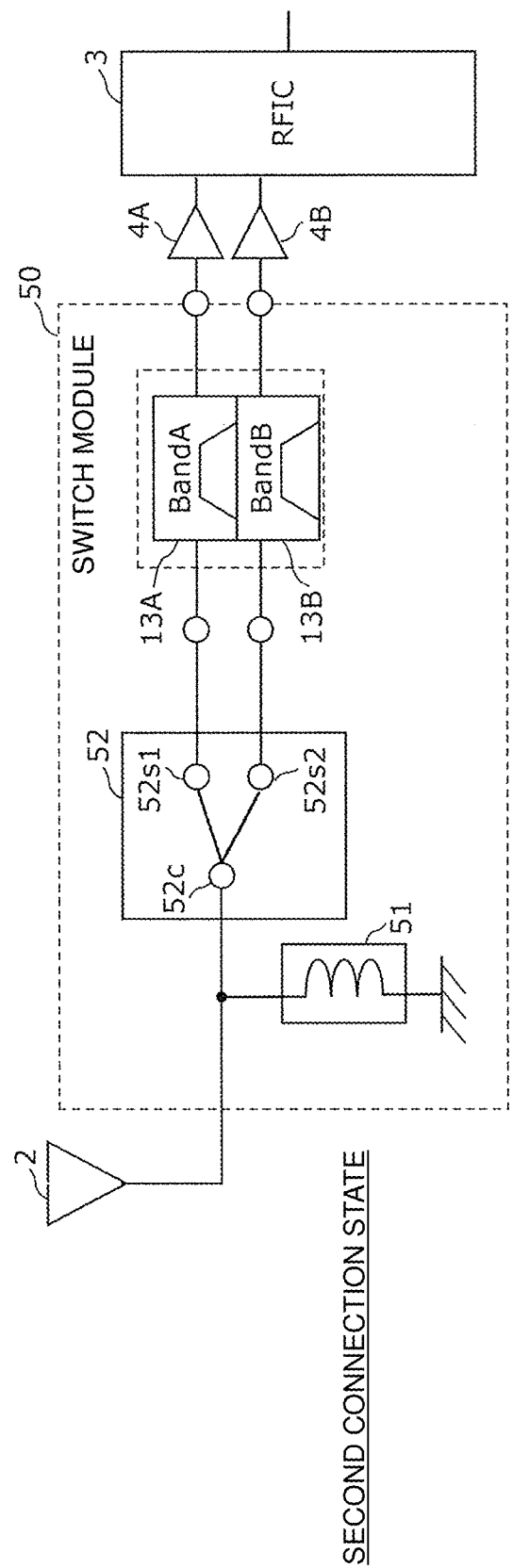
FIG. 2B is a circuit configuration diagram in a second connection state of the switch module according to the Comparative Example.

FIG. 2A is a circuit configuration diagram in a first connection state (non-CA mode) of a switch module 50 according to a Comparative Example. FIG. 2B is a circuit configuration diagram in a second connection state (CA mode) of the switch module 50 according to the Comparative Example. FIGS. 2A and 2B show the switch module 50 according to the Comparative Example, the antenna element 2, the reception signal amplifier circuits 4A, 4B, and the RF signal processing circuit (RFIC) 3.

The switch module 50 according to this Comparative Example differs from the switch module 1A according to the Example 1 in that no filter 14X is provided. Hereinafter, for the switch module 50, the description of the same or similar points as those of the switch module 1A is omitted, and different points will be mainly described.

The switch module 50 includes an antenna matching circuit 51, an antenna switch 52, and the filters 13A, 13B.

The antenna switch 52 is a switch circuit including a common terminal 52c connected to the antenna element, a selection terminal 52s1 connected to one end of the filter 13A, and a selection terminal 52s2 connected to one end of the filter 13B. With the above configuration, the antenna switch 52 switches connection of the common terminal 52c with at least one of the selection terminal 52s1 and the selection terminal 52s2.

The circuit configuration of the switch module 50 shown in FIG. 2A represents a first connection state where, of the first frequency band and the second frequency band, the first frequency band is selected as a band to propagate an RF reception signal. As shown in FIG. 2A, in the first connection state (non-CA mode), the antenna switch 52 connects the common terminal 52c and the selection terminal 52s1. Thus, in the first connection state, a first circuit including the connected antenna element 2, antenna switch 52, and filter 13A is provided.

The circuit configuration of the switch module 50 shown in FIG. 2B represents a second connection state where both the first frequency band and the second frequency band are selected as bands to propagate RF reception signals in parallel. As shown in FIG. 2B, in the second connection state (CA mode), the antenna switch 52 connects the common terminal 52c and the selection terminal 52s1 and connects the common terminal 52c and the selection terminal 52s2. Thus, in the second connection state, a second circuit including the connected antenna element 2, antenna switch 52, and filters 13A, 13B is provided.

In the second circuit in the second connection state (CA mode), the filter 13B in the first frequency band defines and functions as, for example, a capacitor. Then, when the CA mode (FIG. 2B) shifts into the non-CA mode (FIG. 2A) and the number of filters connected in parallel with the common terminal 12c changes, an impedance when the filter circuit is viewed from the common terminal 12c changes. For this reason, in the switch module 50 according to this Comparative Example, any one of optimizing impedance matching in one of the CA mode (FIG. 2B) and the non-CA mode (FIG. 2A) (sacrificing impedance matching for the other) and adjusting impedance matching to an intermediate mode between the CA mode (FIG. 2B) and the non-CA mode (FIG. 2A) is selected. In any case, there is inconvenience in that the reflection characteristics and bandpass characteristics of the filter 13A degrade.

Figure 3B:
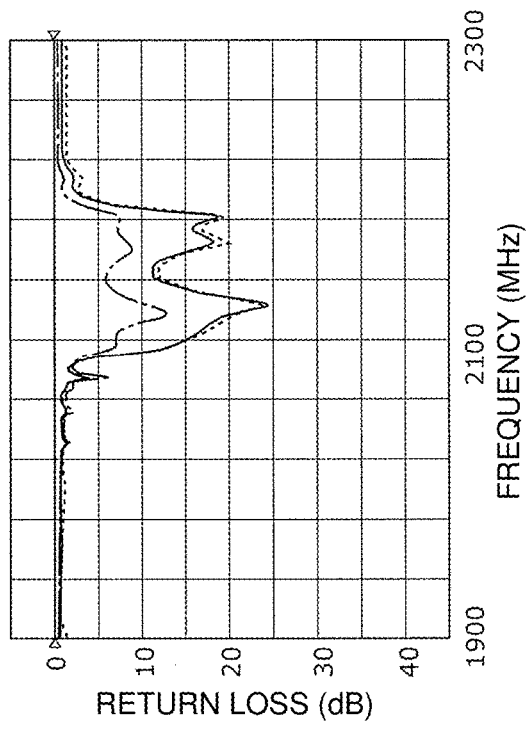
FIGS. 3A and 3B show graphs in which the bandpass characteristics and reflection characteristics of the switch module according to the Example 1 and the bandpass characteristics and reflection characteristics of the switch module according to the Comparative Example are compared with each other.
Figure 3A:
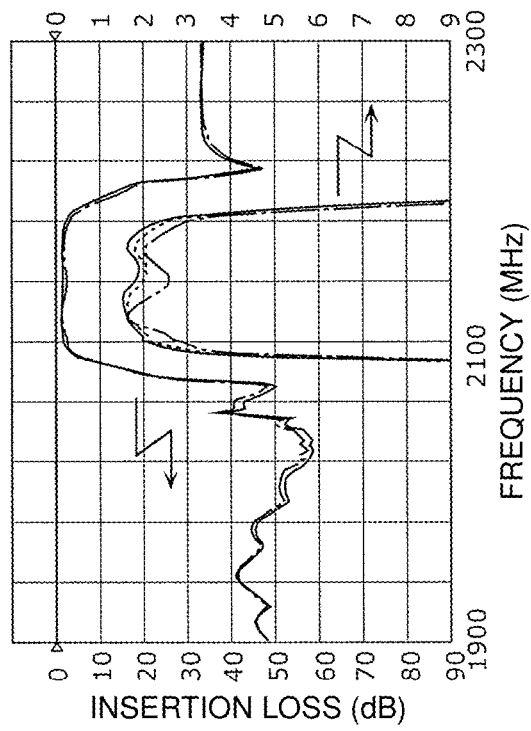

3. Comparison in Characteristics Between Switch Module According to the Example 1 and Switch Module According to the Comparative Example FIGS. 3A and 3B show graphs in which the bandpass characteristics and reflection characteristics of the switch module according to the Example 1 and the bandpass characteristics and reflection characteristics of the switch module according to the Comparative Example are compared with each other. FIG. 3A shows the bandpass characteristics of the filter 13A in the first connection state (non-CA mode) and the bandpass characteristics of the filter 13A in the second connection state (CA mode). In the second connection state (CA mode), the circuit configurations of the Example 1 and the Comparative Example are the same or substantially the same, so the bandpass characteristics of the filter 13A are the same or substantially the same (dashed line in FIGS. 3A and 3B). FIG. 3B shows the reflection characteristics of the filter 13A in the first connection state (non-CA mode) and the reflection characteristics of the filter 13A in the second connection state (CA mode). In the second connection state (CA mode), the circuit configurations of the Example 1 and the Comparative Example are the same or substantially the same, so the reflection characteristics of the filter 13A are the same or substantially the same (dashed line in FIGS. 3A and 3B).

The filter 13A according to the Example 1 is a surface acoustic wave resonator whose pass band (first frequency band) is the receiving band of Band 1. The filter 13B is a surface acoustic wave resonator whose pass band (second frequency band) is the receiving band of Band 3. The filter 14X has the receiving band of Band 30 as a pass band (third frequency band). The filter 14X is a surface acoustic wave resonator that uses leaky waves that propagate in a piezoelectric layer made of LiTaO$_3$.

As shown in FIG. 3B, a return loss in the pass band of the filter 13A according to the Comparative Example in the first connection state (non-CA mode) is less than a return loss in the second connection state (CA mode). This indicates that an impedance in the pass band of the filter 13A according to the Comparative Example in the first connection state (non-CA mode) deviates more from a characteristic impedance than an impedance in the pass band of the filter 13A according to the Comparative Example in the second connection state (CA mode).

Accordingly, as shown in FIG. 3A, an insertion loss in the pass band of the filter 13A according to the Comparative Example in the first connection state (non-CA mode) is greater than an insertion loss in the second connection state (CA mode).

In contrast to this, as shown in FIG. 3B, a return loss in the pass band of the filter 13A according to the Example 1 in the second connection state (CA mode) is not substantially different from a return loss in the first connection state (non-CA mode). This indicates that an impedance in the pass band of the filter 13A according to the Example 1 in the first connection state (non-CA mode), as well as an impedance in the pass band of the filter 13A according to the Example 1 in the second connection state (CA mode), is near the characteristic impedance.

Accordingly, as shown in FIG. 3A, an insertion loss in the pass band of the filter 13A according to the Example 1 is good in both the second connection state (CA mode) and the first connection state (non-CA mode), and low-loss characteristics are maintained. In the filter 13A according to the Example 1, an insertion loss in the pass band in the first connection state (non-CA mode) is less than an insertion loss in the second connection state (CA mode). This can be understood that, in the case of the first connection state (non-CA mode), the filter 14X whose reflection characteristics (quality factor) are good in the first frequency band is connected.

4. Circuit Configuration of Switch Module 1B According to an Example 2

Figure 4A:
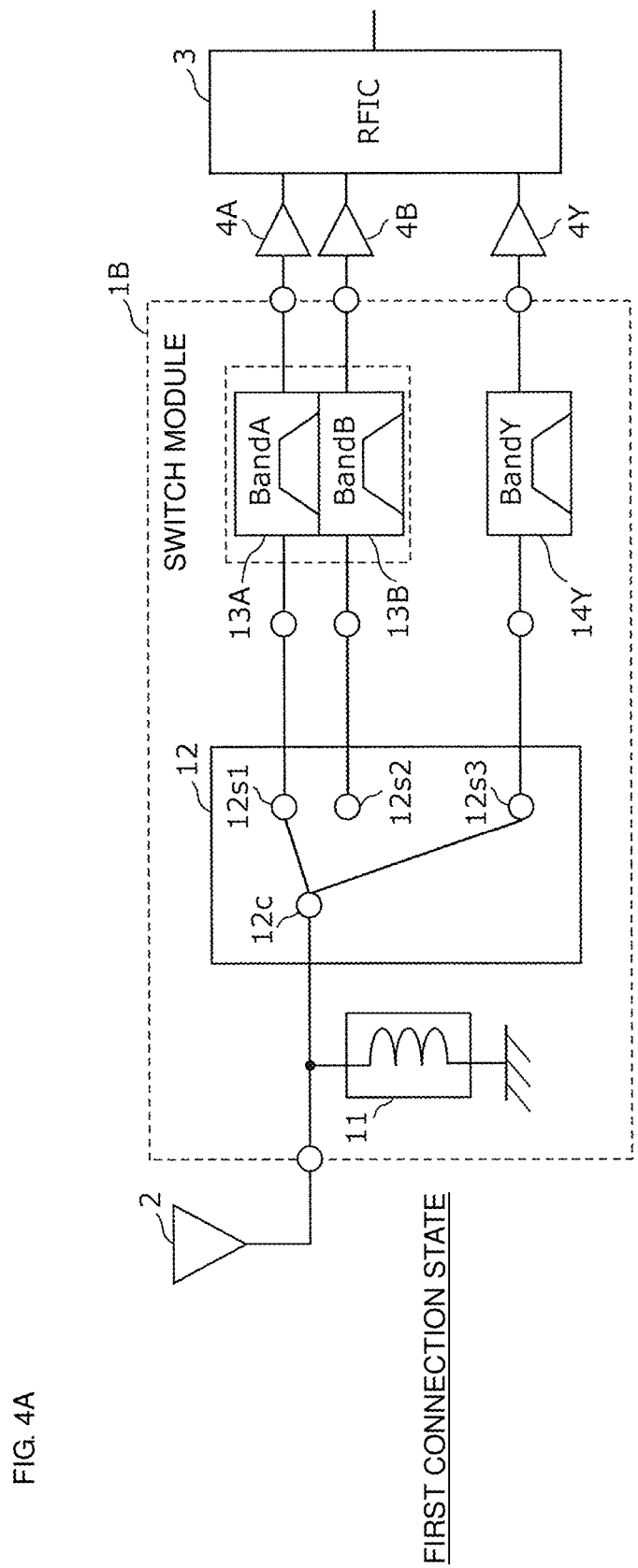
FIG. 4A is a circuit configuration diagram in a first connection state of a switch module according to an Example 2 of a preferred embodiment of the present invention.
Figure 4B:
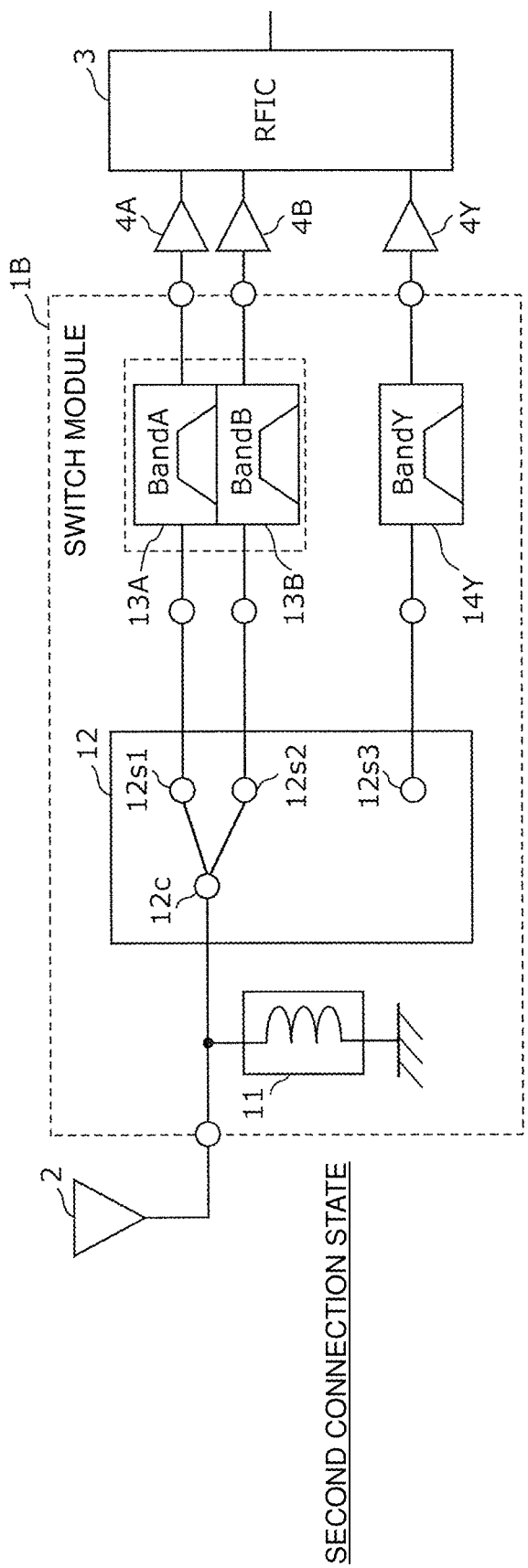
FIG. 4B is a circuit configuration diagram in a second connection state of the switch module according to the Example 2 of a preferred embodiment of the present invention.

FIG. 4A is a circuit configuration diagram in a first connection state of a switch module 1B according to an Example 2 of a preferred embodiment of the present invention. FIG. 4B is a circuit configuration diagram in a second connection state of the switch module 1B according to the Example 2. FIGS. 4A and 4B show the switch module 1B according to the Example 2, the antenna element 2, the reception signal amplifier circuits 4A, 4B, a reception signal amplifier circuit 4Y, and the RF signal processing circuit 3. The switch module 1B, the antenna element 2, and the reception signal amplifier circuits 4A, 4B, 4Y are disposed in, for example, a front-end portion of a cellular phone that supports multiband/multimode functionality. The switch module 1B according to this Example differs from the switch module 1A according to the Example 1 only in the configuration of a filter 14Y connected to the selection terminal 12s3. Hereinafter, for the switch module 1B according to this Example, the description of the same or similar points as those of the switch module 1A according to the Example 1 is omitted, and different points will be mainly described.

The switch module 1B includes the antenna matching circuit 11, the antenna switch 12, and the filters 13A, 13B, 14Y.

The filter 13A is a first filter circuit that selectively passes an RF reception signal of a first frequency band (Band A in FIGS. 4A and 4B). For example, Band 1 (receiving band: about 2110 MHz to about 2170 MHz) of LTE is illustrated as the first frequency band.

The filter 13B is a second filter circuit that selectively passes an RF reception signal in a second frequency band (Band B in FIGS. 4A and 4B) different in frequency band from the first frequency band. For example, Band 3 (receiving band: about 1805 MHz to about 1880 MHz) of LTE is illustrated as the second frequency band. In this Example, the second frequency band is at frequencies lower than the first frequency band.

The filter 14Y is a third filter circuit that selectively passes an RF signal in a third frequency band (Band Y in FIGS. 4A and 4B) different in frequency band from the first frequency band or the second frequency band. For example, Band 25 (receiving band: about 1930 MHz to about 1995 MHz) of LTE is illustrated as the third frequency band. In this Example, the third frequency band lies between the first frequency band and the second frequency band.

The antenna switch 12 is a switch circuit including the common terminal 12c connected to the antenna element 2, the selection terminal 12s1 (first selection terminal) connected to one end of the filter 13A, the selection terminal 12s2 (second selection terminal) connected to one end of the filter 13B, and a selection terminal 12s3 (third selection terminal) connected to one end of the filter 14Y. With the above configuration, the antenna switch 12 switches connection of the common terminal 12c with at least one of the selection terminals 12s1, 12s2, 12s3.

The reception signal amplifier circuit 4Y includes a low-noise amplifier that amplifies the electric power of a radio-frequency reception signal of the third frequency band (Band Y).

With the above circuit configuration, the switch module 1B according to this Example is able to switch among at least (1) a first state (CA mode) where a radio-frequency signal of the first frequency band and a radio-frequency signal of the second frequency band are propagated in parallel, (2) a second state (non-CA mode) where, of a radio-frequency signal of the first frequency band and a radio-frequency signal of the second frequency band, only the radio-frequency signal of the first frequency band is propagated, and (3) a third state where a radio-frequency signal of the first frequency band and a radio-frequency signal of the second frequency band are not propagated and a radio-frequency signal of the third frequency band is propagated.

The first connection state of the switch module 1B, shown in FIG. 4A, is the second state, and corresponds to the non-CA mode in which only a single frequency band is selected. More specifically, the first connection state (second state: non-CA mode) is a state where the common terminal 12c and the selection terminal 12s1 are connected, the common terminal 12c and the selection terminal 12s2 are not connected, and the common terminal 12c and the selection terminal 12s3 are connected.

The second connection state of the switch module 1B, shown in FIG. 4B, is the first state, and corresponds to the CA mode in which an RF reception signal of the first frequency band and an RF reception signal of the second frequency band are propagated in parallel. More specifically, the second connection state (first state: CA mode) is a state where the common terminal 12c and the selection terminal 12s1 are connected, the common terminal 12c and the selection terminal 12s2 are connected, and the common terminal 12c and the selection terminal 12s3 are not connected.

An impedance in the first frequency band when the filter 14Y alone is viewed from one end (input terminal) of the filter 14Y is equal or substantially equal to an impedance in the first frequency band when the filter 13B alone is viewed from one end (input terminal) of the filter 13B.

With this configuration, in the first connection state (second state: non-CA mode), not only the filter 13A but also the filter 14Y are connected to the common terminal 12c. Therefore, an impedance in the first frequency band of the filter 13A in the first connection state (second state: non-CA mode) can be equalized or substantially equalized to (brought close to) an impedance in the first frequency band of the filter 13A in the second connection state (first state: CA mode). Thus, even when the connection status of the antenna switch 12 is changed between the first connection state and the second connection state, a change in impedance at the common terminal 12c is reduced or prevented. Therefore, the degradation of insertion loss and return loss in the pass band of the filter 13A is reduced or prevented.

In the first connection state (second state: non-CA mode), the filter 14Y that is used in the third state is used, such that no impedance matching circuit element in the first state or the second state is additionally required. Thus, space saving and miniaturization of the switch module 1B are possible.

In this Example, the filter 14Y is preferably, for example, a surface acoustic wave resonator that uses Rayleigh waves that propagate in a piezoelectric layer made of $LiNbO_3$ or an acoustic wave resonator (bulk acoustic wave resonator) that uses bulk waves. The third frequency band lies between the first frequency band and the second frequency band. The filter 14Y that is a surface acoustic wave resonator that uses Rayleigh waves that propagate in a piezoelectric layer made of $LiNbO_3$ or an acoustic wave resonator that uses bulk waves has characteristics such that a reflection coefficient in both the higher frequency range and lower frequency range is greater than a reflection coefficient in the pass band (third frequency band) (a quality factor in both the higher frequency range and lower frequency range is higher than a quality factor in the pass band (third frequency band)). Therefore, by adjusting the stop band of the filter 14Y to the first frequency band, an insertion loss in the first frequency band of the filter 13A in the first connection state (second state: non-CA mode) is reduced or prevented.

A capacitance in the first frequency band when the filter 14Y alone is viewed from one end (input terminal) of the filter 14Y is equal or substantially equal to a capacitance in the first frequency band when the filter 13B alone is viewed from one end (input terminal) of the filter 13B.

A surface acoustic wave resonator that uses Rayleigh waves that propagate in a piezoelectric layer made of $LiNbO_3$ or an acoustic wave resonator that uses bulk waves has a capacitive impedance due to its structure. Therefore, impedances are equalized or substantially equalized (brought close to each other) by equalizing or substantially equalizing (bringing) a capacitance in the first frequency band of the filter 13A in the first connection state (second state: non-CA mode) to a capacitance in the second connection state (first state: CA mode). Thus, an insertion loss in the first frequency band of the filter 13A is reduced regardless of whether the connection status is the first state or the second state.

In this Example, the case where only the first frequency band is selected as a non-CA mode is illustrated. However, the switch module 1B according to this Example is also applicable to a system in which only the second frequency band is selected as a non-CA mode. In the case of the non-CA mode in which only the second frequency band is selected, the filter 14Y having a capacitance value in the second frequency band equal or substantially equal to an equivalent capacitance value in the second frequency band of the filter 13A just needs to be disposed.

Figure 5B:
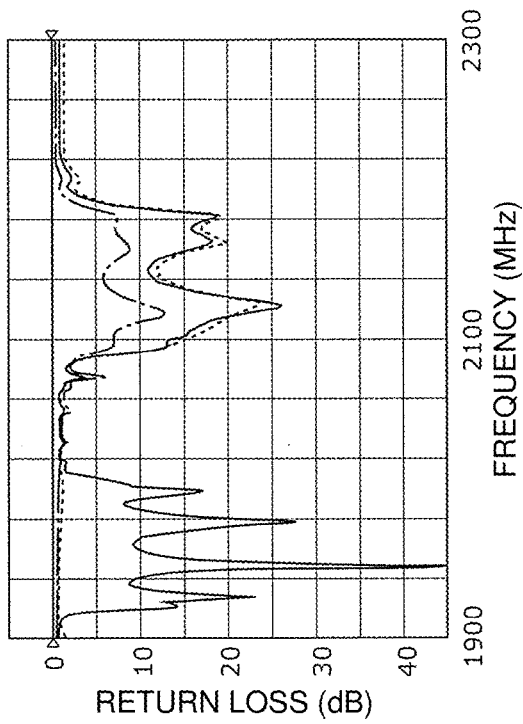
FIGS. 5A and 5B show graphs in which the bandpass characteristics and reflection characteristics of the switch module according to Example 2 and the bandpass characteristics and reflection characteristics of the switch module according to a Comparative Example are compared with each other.
Figure 5A:
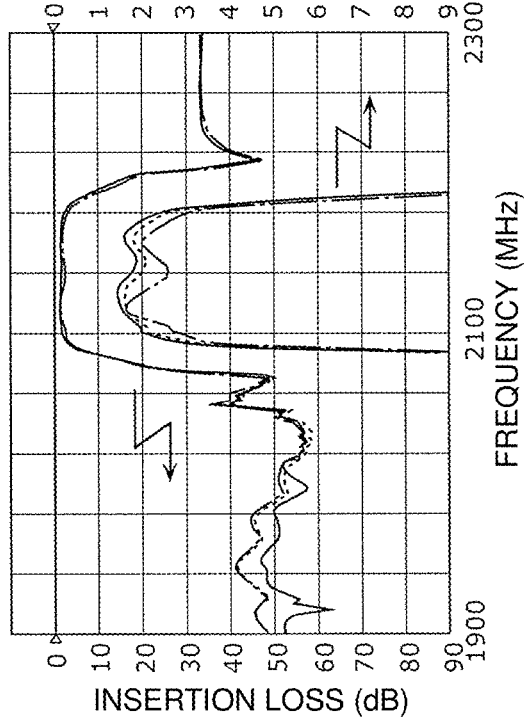

5. Comparison in Characteristics Between Switch Module According to the Example 2 and Switch Module According to a Comparative Example FIGS. 5A and 5B show graphs in which the bandpass characteristics and reflection characteristics of the switch module according to Example 2 and the bandpass characteristics and reflection characteristics of the switch module according to a Comparative Example are compared with each other. FIG. 5A shows the bandpass characteristics of the filter 13A in the first connection state (non-CA mode) and the bandpass characteristics of the filter 13A in the second connection state (CA mode). In the second connection state (CA mode), the circuit configurations of the Example 2 and the Comparative Example are the same or substantially the same, so the bandpass characteristics of the filter 13A are the same or substantially the same (dashed line in FIGS. 5A and 5B). FIG. 5B shows the reflection characteristics of the filter 13A in the first connection state (non-CA mode) and the reflection characteristics of the filter 13A in the second connection state (CA mode). In the second connection state (CA mode), the circuit configurations of the Example 2 and the Comparative Example are the same or substantially the same, so the reflection characteristics of the filter 13A are the same or substantially the same (dashed line in FIGS. 5A and 5B).

The filter 13A according to the Example 2 is a surface acoustic wave resonator whose pass band (first frequency band) is the receiving band of Band 1. The filter 13B is a surface acoustic wave resonator whose pass band (second frequency band) is the receiving band of Band 3. The filter 14Y has the receiving band of Band 25 as a pass band (third frequency band). The filter 14Y is a surface acoustic wave resonator that uses Rayleigh waves that propagate in a piezoelectric layer made of $LiNbO_3$ or an acoustic wave resonator that uses bulk waves.

As shown in FIG. 5B, a return loss in the pass band of the filter 13A according to the Comparative Example in the first connection state (non-CA mode) is less than a return loss in the second connection state (CA mode). This indicates that an impedance in the pass band of the filter 13A according to the Comparative Example in the first connection state (non-CA mode) deviates from a characteristic impedance more than an impedance in the pass band of the filter 13A according to the Comparative Example in the second connection state (CA mode).

Accordingly, as shown in FIG. 5A, an insertion loss in the pass band of the filter 13A according to the Comparative Example in the first connection state (non-CA mode) is greater than an insertion loss in the second connection state (CA mode).

In contrast to this, as shown in FIG. 5B, a return loss in the pass band of the filter 13A according to the Example 2 in the second connection state (CA mode) is not substantially different from a return loss in the first connection state (non-CA mode). This indicates that an impedance in the pass band of the filter 13A according to the Example 2 in the first connection state (non-CA mode), as well as an impedance in the pass band of the filter 13A according to the Example 2 in the second connection state (CA mode), are near the characteristic impedance.

Accordingly, as shown in FIG. 5A, an insertion loss in the pass band of the filter 13A according to the Example 2 is good in both the second connection state (CA mode) and the first connection state (non-CA mode), and low-loss characteristics are maintained. In the filter 13A according to the Example 2, an insertion loss in the pass band in the first connection state (non-CA mode) is less than an insertion loss in the second connection state (CA mode). This can be understood that, in the case of the first connection state (non-CA mode), the filter 14Y whose reflection characteristics (quality factor) are good in the first frequency band is connected.

6. Circuit Configuration of Switch Module 1C According to Example 3

Figure 6A:
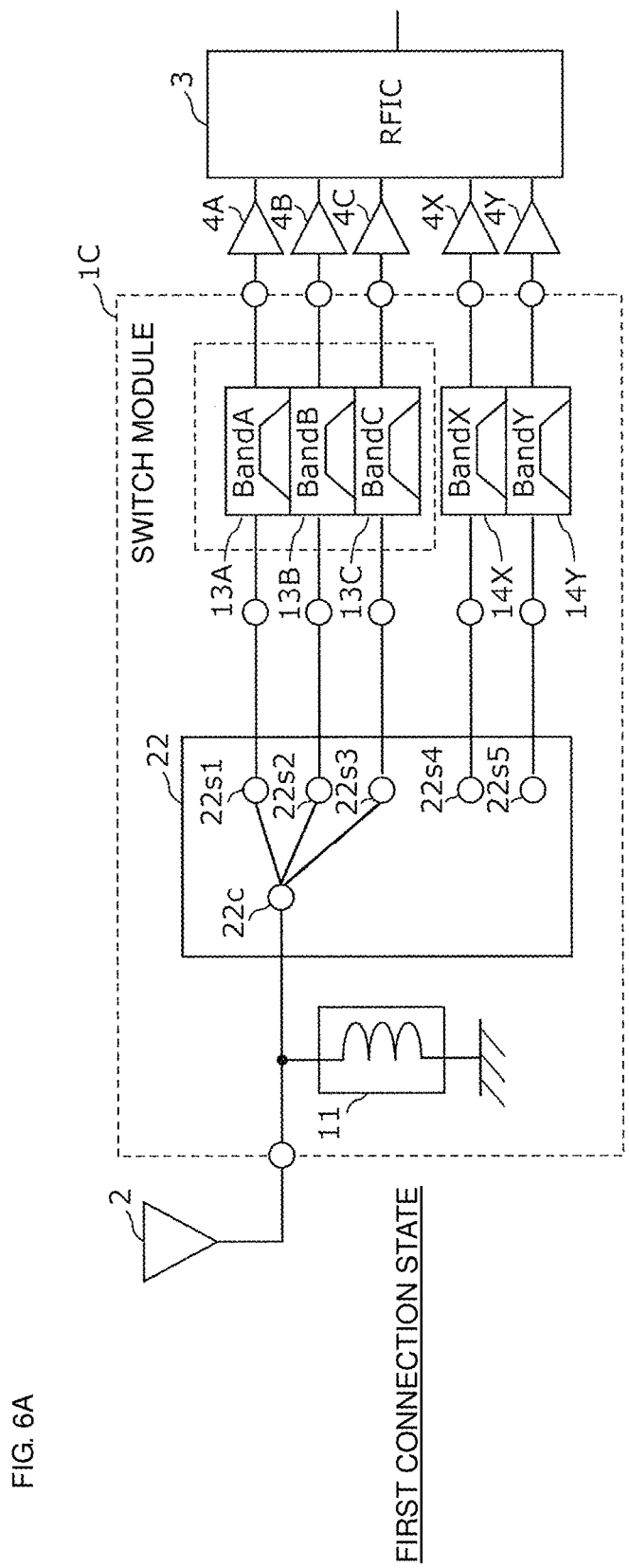
FIG. 6A is a circuit configuration diagram in a first connection state of a switch module according to an Example 3 of a preferred embodiment of the present invention.
Figure 6B:
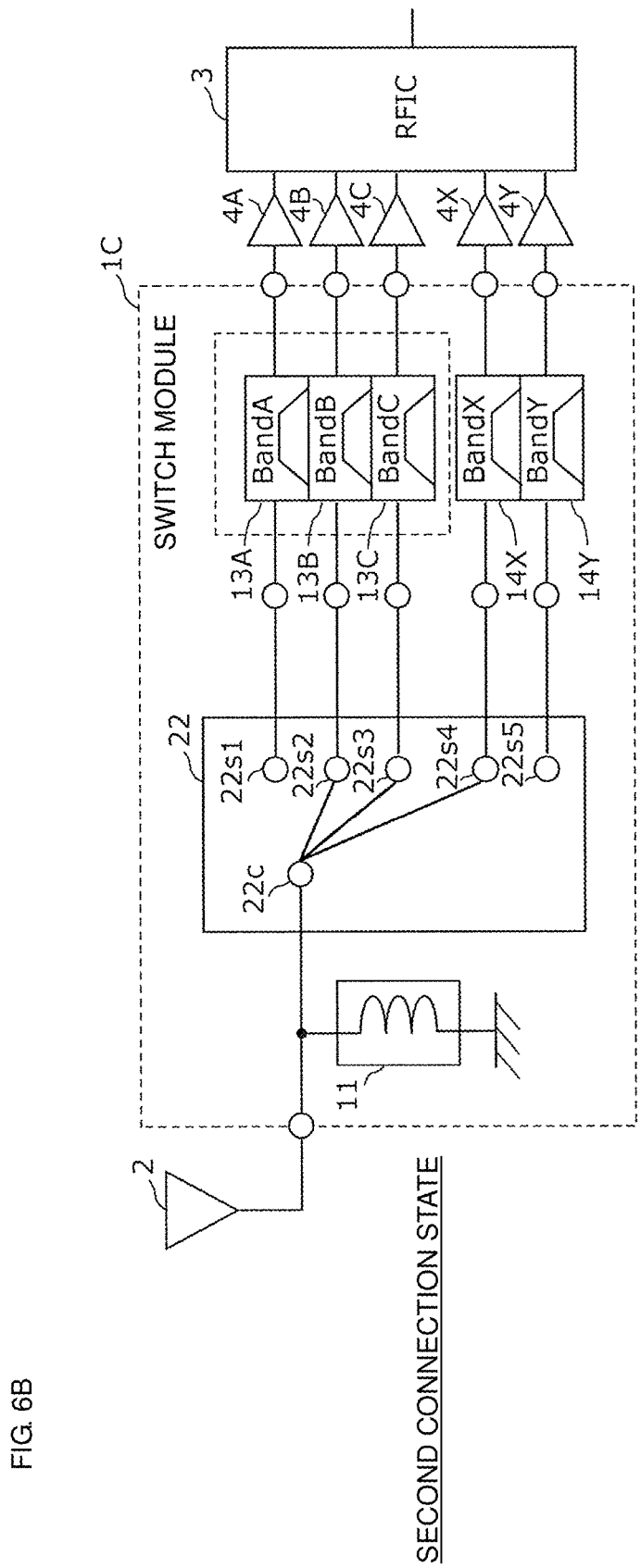
FIG. 6B is a circuit configuration diagram in a second connection state of the switch module according to the Example 3 of a preferred embodiment of the present invention.
Figure 6C:
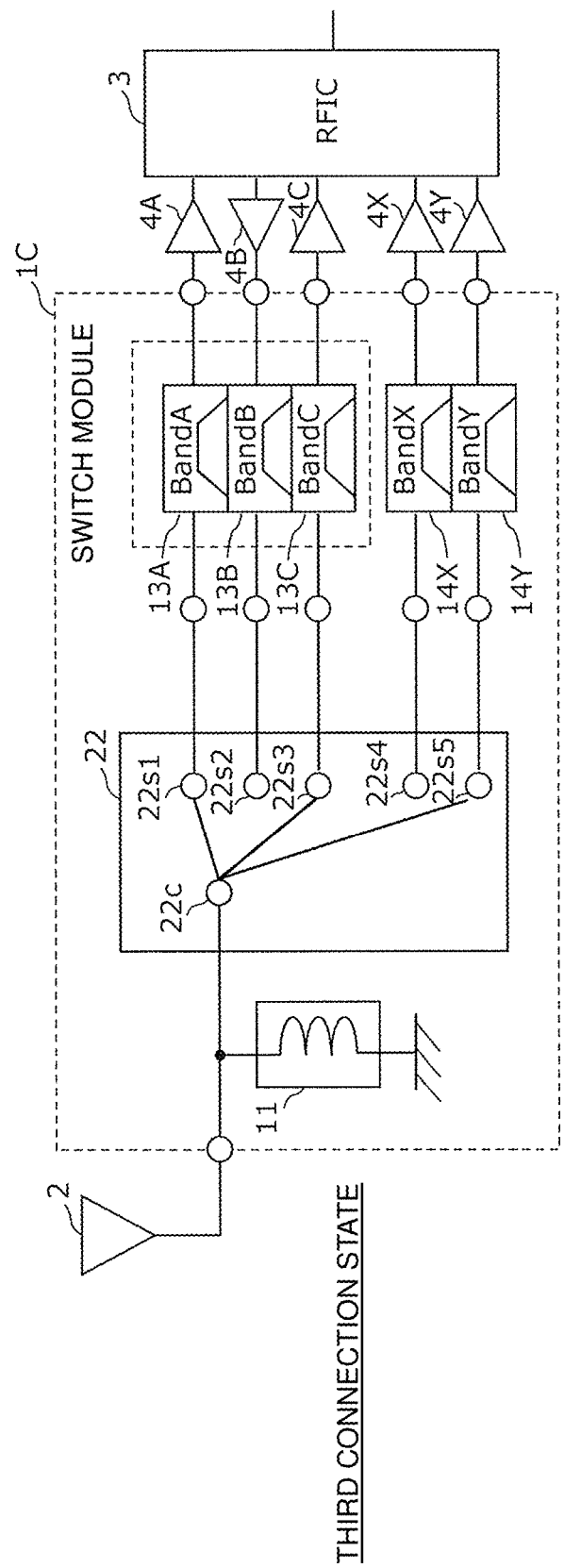
FIG. 6C is a circuit configuration diagram in a third connection state of the switch module according to the Example 3 of a preferred embodiment of the present invention.
Figure 6D:
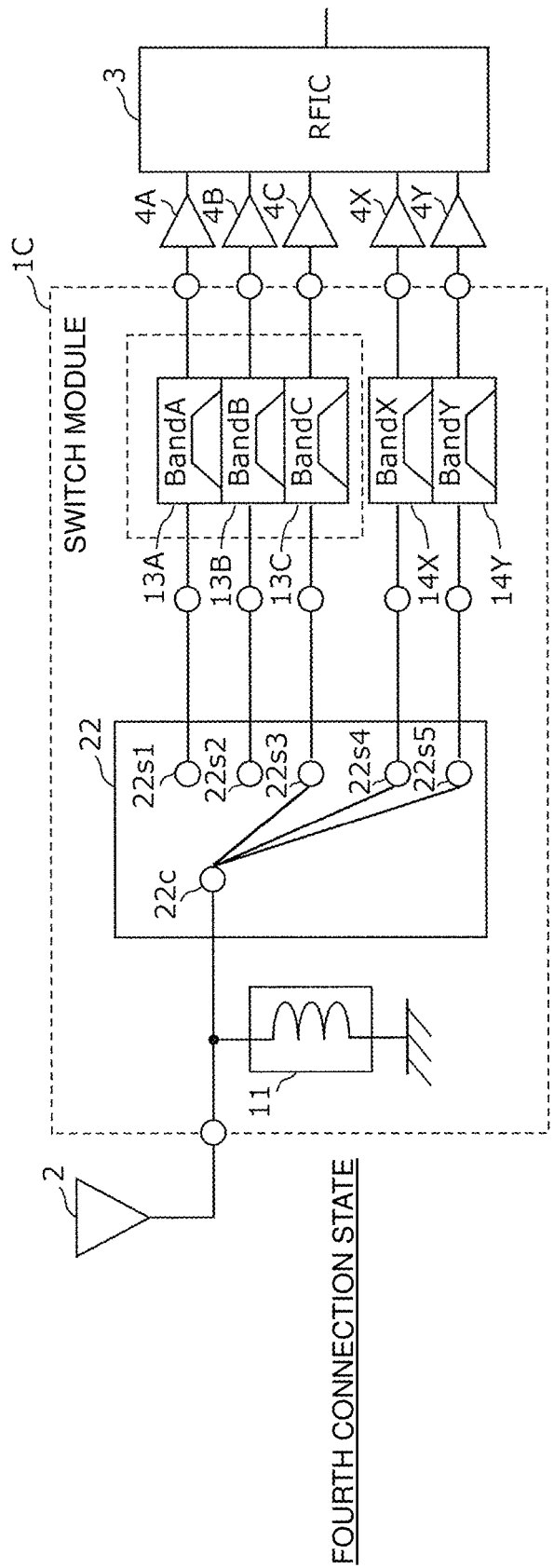
FIG. 6D is a circuit configuration diagram in a fourth connection state of the switch module according to the Example 3 of a preferred embodiment of the present invention.

FIG. 6A is a circuit configuration diagram in a first connection state of the switch module 1C according to an Example 3 of a preferred embodiment of the present invention. FIG. 6B is a circuit configuration diagram in a second connection state of the switch module 1C according to the Example 3. FIG. 6C is a circuit configuration diagram in a third connection state of the switch module 1C according to the Example 3. FIG. 6D is a circuit configuration diagram in a fourth connection state of the switch module 1C according to the Example 3. FIGS. 6A to 6D show the switch module 1C according to the Example 3, the antenna element 2, the reception signal amplifier circuits 4A, 4B, 4X, 4Y, a reception signal amplifier circuit 4C, and the RF signal processing circuit 3. The switch module 1C, the antenna element 2, and the reception signal amplifier circuits 4A, 4B, 4C, 4X, 4Y are disposed in, for example, a front-end portion of a cellular phone that supports multiband/multimode functionality. The switch module 1C according to this Example differs from the switch module 1A according to the Example 1 in that the number of the selection terminals of an antenna switch 22 is increased as a result of the configuration in which the number of frequency bands that are used in parallel is three at the maximum. Hereinafter, for the switch module 1C according to this Example, the description of the same or similar points as those of the switch module 1A according to the Example 1 is omitted, and different points will be mainly described.

The switch module 1C includes the antenna matching circuit 11, the antenna switch 22, the filters 13A, 13B, 14X, 14Y, and a filter 13C.

The filter 13A is a first filter circuit that selectively passes an RF reception signal of a first frequency band (Band A in FIGS. 6A to 6D). For example, Band 1 (receiving band: about 2110 MHz to about 2170 MHz) of LTE is illustrated as the first frequency band.

The filter 13B is a second filter circuit that selectively passes an RF reception signal of a second frequency band (Band B in FIGS. 6A to 6D) different in frequency band from the first frequency band. For example, Band 3 (receiving band: about 1805 MHz to about 1880 MHz) of LTE is illustrated as the second frequency band. In this Example, the second frequency band is at frequencies lower than the first frequency band.

The filter 13C is a third filter circuit that selectively passes an RF reception signal of a third frequency band (Band C in FIGS. 6A to 6D) different in frequency band from the first frequency band or the second frequency band. For example, Band 7 (receiving band: about 2620 MHz to about 2690 MHz) of LTE is illustrated as the third frequency band. In this Example, the third frequency band is at frequencies higher than the first frequency band.

The filter 14X is a fourth filter circuit that selectively passes an RF signal of a fourth frequency band (Band X in FIGS. 6A to 6D) different in frequency band from the first frequency band, the second frequency band, or the third frequency band. For example, Band 30 (receiving band: about 2350 MHz to about 2360 MHz) of LTE is illustrated as the fourth frequency band. In this Example, the fourth frequency band is at frequencies higher than the first frequency band or the second frequency band and is at frequencies lower than the third frequency band.

The filter 14Y is a fifth filter circuit that selectively passes an RF signal of a fifth frequency band (Band Y in FIGS. 6A to 6D) different in frequency band from the first frequency band, the second frequency band, the third frequency band, or the fourth frequency band. For example, Band 25 (receiving band: about 1930 MHz to about 1995 MHz) of LTE is illustrated as the fifth frequency band. In this Example, the fifth frequency band is at frequencies higher than the second frequency band and is at frequencies lower than the first frequency band, the third frequency band, or the fourth frequency band.

The antenna switch 22 is a switch circuit including the common terminal 12c connected to the antenna element 2, the selection terminal 12s1 (first selection terminal) connected to one end of the filter 13A, the selection terminal 12s2 (second selection terminal) connected to one end of the filter 13B, the selection terminal 12s3 (third selection terminal) connected to one end of the filter 13C, a selection terminal 12s4 (fourth selection terminal) connected to one end of the filter 14X, and a selection terminal 12s5 (fifth selection terminal) connected to one end of the filter 14Y. With the above configuration, the antenna switch 22 switches connection of the common terminal 12c with at least one of the selection terminals 12s1, 12s2, 12s3, 12s4, 12s5.

With the above circuit configuration, the switch module 1C according to this Example is able to switch among at least (1) a first state (3CA mode) where a radio-frequency signal of a first frequency band, a radio-frequency signal of a second frequency band, and a radio-frequency signal of a third frequency band are propagated in parallel, (2) a second state (2CA mode 1) where, of a radio-frequency signal of the first frequency band, a radio-frequency signal of the second frequency band, and a radio-frequency signal of the third frequency band, only the radio-frequency signal of the second frequency band and the radio-frequency signal of the third frequency band are propagated in parallel, (3) a third state (2CA mode 2) where, of a radio-frequency signal of the first frequency band, a radio-frequency signal of the second frequency band, and a radio-frequency signal of the third frequency band, only the radio-frequency signal of the first frequency band and the radio-frequency signal of the third frequency band are propagated in parallel, (4) a fourth state (non-CA mode) where, of a radio-frequency signal of the first frequency band, a radio-frequency signal of the second frequency band, and a radio-frequency signal of the third frequency band, only the radio-frequency signal of the third frequency band is propagated, (5) a fifth state where a radio-frequency signal of the first frequency band, a radio-frequency signal of the second frequency band, and a radio-frequency signal of the third frequency band are not propagated and a radio-frequency signal of a fourth frequency band is propagated, and (6) a sixth state where a radio-frequency signal of the first frequency band, a radio-frequency signal of the second frequency band, and a radio-frequency signal of the third frequency band are not propagated and a radio-frequency signal of a fifth frequency band is propagated.

The first connection state of the switch module 1C, shown in FIG. 6A, is the first state, and corresponds to the CA mode (3CA mode) in which an RF reception signal of the first frequency band, an RF reception signal of the second frequency band, and an RF reception signal of the third frequency band are propagated in parallel. More specifically, the first connection state (first state: 3CA mode) is a state where the common terminal 12c and the selection terminal 12s1 are connected, the common terminal 12c and the selection terminal 12s2 are connected, the common terminal 12c and the selection terminal 12s3 are connected, the common terminal 12c and the selection terminal 12s4 are not connected, and the common terminal 12c and the selection terminal 12s5 are not connected.

The second connection state of the switch module 1C, shown in FIG. 6B, is the second state, and corresponds to the CA mode (2CA mode 1) in which an RF reception signal of the second frequency band and an RF reception signal of the third frequency band are propagated in parallel. More specifically, the second connection state (second state: 2CA mode 1) is a state where the common terminal 12c and the selection terminal 12s1 are not connected, the common terminal 12c and the selection terminal 12s2 are connected, the common terminal 12c and the selection terminal 12s3 are connected, the common terminal 12c and the selection terminal 12s4 are not connected, and the common terminal 12c and the selection terminal 12s5 are not connected.

An impedance in the second frequency band when the filter 14X alone is viewed from one end (input terminal) of the filter 14X is equal or substantially equal to an impedance in the second frequency band when the filter 13A alone is viewed from one end (input terminal) of the filter 13A. An impedance in the third frequency band when the filter 14X alone is viewed from one end (input terminal) of the filter 14X is equal or substantially equal to an impedance in the third frequency band when the filter 13A alone is viewed from one end (input terminal) of the filter 13A.

With this configuration, in the second connection state (second state: 2CA mode 1), not only the filters 13B, 13C but also the filter 14X are connected to the common terminal 12c. Therefore, an impedance in the second frequency band of the filter 13B in the second connection state (second state: 2CA mode 1) can be equalized or substantially equalized to (brought close to) an impedance in the second frequency band of the filter 13B in the first connection state (first state: 3CA mode). An impedance in the third frequency band of the filter 13C in the second connection state (second state: 2CA mode 1) can be equalized or substantially equalized to (brought close to) an impedance in the third frequency band of the filter 13C in the first connection state (first state: 3CA mode). Thus, even when the connection status of the antenna switch 22 is changed between the first connection state and the second connection state, a change in impedance at the common terminal 12c is reduced or prevented. Therefore, the degradation of insertion loss and return loss in the pass band of each of the filters 13B, 13C is reduced or prevented.

The third connection state of the switch module 1C, shown in FIG. 6C, is the third state, and corresponds to the CA mode (2CA mode 2) in which an RF reception signal of the first frequency band and an RF reception signal of the third frequency band are propagated in parallel. More specifically, the third connection state (third state: 2CA mode 2) is a state where the common terminal 12c and the selection terminal 12s1 are connected, the common terminal 12c and the selection terminal 12s2 are not connected, the common terminal 12c and the selection terminal 12s3 are connected, the common terminal 12c and the selection terminal 12s4 are not connected, and the common terminal 12c and the selection terminal 12s5 are connected.

An impedance in the first frequency band when the filter 14Y alone is viewed from one end (input terminal) of the filter 14Y is equal or substantially equal to an impedance in the first frequency band when the filter 13B alone is viewed from one end (input terminal) of the filter 13B. An impedance in the third frequency band when the filter 14Y alone is viewed from one end (input terminal) of the filter 14Y is equal or substantially equal to an impedance in the third frequency band when the filter 13B alone is viewed from one end (input terminal) of the filter 13B.

With this configuration, in the third connection state (third state: 2CA mode 2), not only the filters 13A, 13C but also the filter 14Y are connected to the common terminal 12c. An impedance in the first frequency band of the filter 13A in the third connection state (third state: 2CA mode 2) can be equalized or substantially equalized to (brought close to) an impedance in the first frequency band of the filter 13A in the first connection state (first state: 3CA mode). An impedance in the third frequency band of the filter 13C in the third connection state (third state: 2CA mode 2) can be equalized or substantially equalized to (brought close to) an impedance in the third frequency band of the filter 13C in the first connection state (first state: 3CA mode). Thus, even when the connection status of the antenna switch 22 is changed between the first connection state and the third connection state, a change in impedance at the common terminal 12c is reduced or prevented. Therefore, the degradation of insertion loss and return loss in the pass band of each of the filters 13A, 13C is reduced or prevented.

The fourth connection state of the switch module 1C, shown in FIG. 6D, is the fourth state, and corresponds to the non-CA mode in which only a single frequency band is selected. More specifically, the fourth connection state (fourth state: non-CA mode) is a state where the common terminal 12c and the selection terminal 12s1 are not connected, the common terminal 12c and the selection terminal 12s2 are not connected, the common terminal 12c and the selection terminal 12s3 are connected, the common terminal 12c and the selection terminal 12s4 are connected, and the common terminal 12c and the selection terminal 12s5 are connected.

An impedance in the third frequency band when a parallel circuit of the filters 14X, 14Y is viewed from one ends (input terminals) of the filters 14X, 14Y is equal or substantially equal to an impedance in the third frequency band when a parallel circuit of the filters 13A, 13B is viewed from one ends (input terminals) of the filters 13A, 13B.

With this configuration, in the fourth connection state (fourth state: non-CA mode), not only the filter 13C but also the filters 14X, 14Y are connected to the common terminal 12c. Therefore, an impedance in the third frequency band of the filter 13C in the fourth connection state (fourth state: non-CA mode) can be equalized or substantially equalized to (brought close to) an impedance in the third frequency band of the filter 13C in the first connection state (first state: CA mode). Thus, even when the connection status of the antenna switch 22 is changed between the first connection state and the fourth connection state, a change in impedance at the common terminal 12c is reduced or prevented. Therefore, the degradation of insertion loss and return loss in the pass band of the filter 13C is reduced or prevented.

In the second to fourth connection states, the filter 14X that is used in the fifth state and the filter 14Y that is used in the sixth state are used, such that no impedance matching circuit element in each of the second to fourth states is additionally required. Thus, space saving and miniaturization of the switch module 1C are possible.

In this Example, the filter 14X is preferably, for example, a surface acoustic wave resonator that uses leaky waves that propagate in a piezoelectric layer made of $LiTaO_3$. The filter 14X that uses leaky waves that propagate in a piezoelectric layer made of $LiTaO_3$ has characteristics such that a reflection coefficient in a lower frequency range than the pass band (fourth frequency band) is greater than a reflection coefficient in a higher frequency range than the pass band (a quality factor in a lower frequency range than the pass band is higher than a quality factor in a higher frequency range than the pass band). Therefore, by adjusting the lower frequency range of the filter 14X to any one of the pass bands of the filters 13A to 13C, an insertion loss of the filters 13A to 13C in each of the second to fourth connection states is reduced or prevented.

In this Example, the filter 14Y is preferably, for example, a surface acoustic wave resonator that uses Rayleigh waves that propagate in a piezoelectric layer made of $LiNbO_3$ or an acoustic wave resonator that uses bulk waves. The filter 14Y that is a surface acoustic wave resonator that uses Rayleigh waves that propagate in a piezoelectric layer made of $LiNbO_3$ or an acoustic wave resonator that uses bulk waves has characteristics such that a reflection coefficient in both the higher frequency range and lower frequency range is greater than a reflection coefficient in the pass band (fifth frequency band) (a quality factor in both the higher frequency range and lower frequency range is higher than a quality factor in the pass band (fifth frequency band)). Therefore, by adjusting the stop band of the filter 14Y to any one of the pass bands of the filters 13A to 13C, an insertion loss of the filters 13A to 13C in each of the second to fourth connection states is reduced or prevented.

In this Example, the case where only the third frequency band is selected as a non-CA mode is illustrated. However, the switch module 1C according to this Example is also applicable to a system having a state where only the first frequency band is selected as a non-CA mode and a state where only the second frequency band is selected as a non-CA mode. The switch module 1C is also applicable to a system having a state where the first frequency band and the second frequency band are selected as a 2CA mode.

In this Example, the number of filters that are used in a CA mode is three (filters 13A to 13C) and the number of filters that are also used for impedance matching is two (filters 14X, 14Y), for example. Alternatively, the number of filters that are used in a CA mode may be four or more, and the number of filters that are also used for impedance matching may be three or more.

7. Circuit Configuration of Switch Module 1D According to an Example 4

Figure 7A:
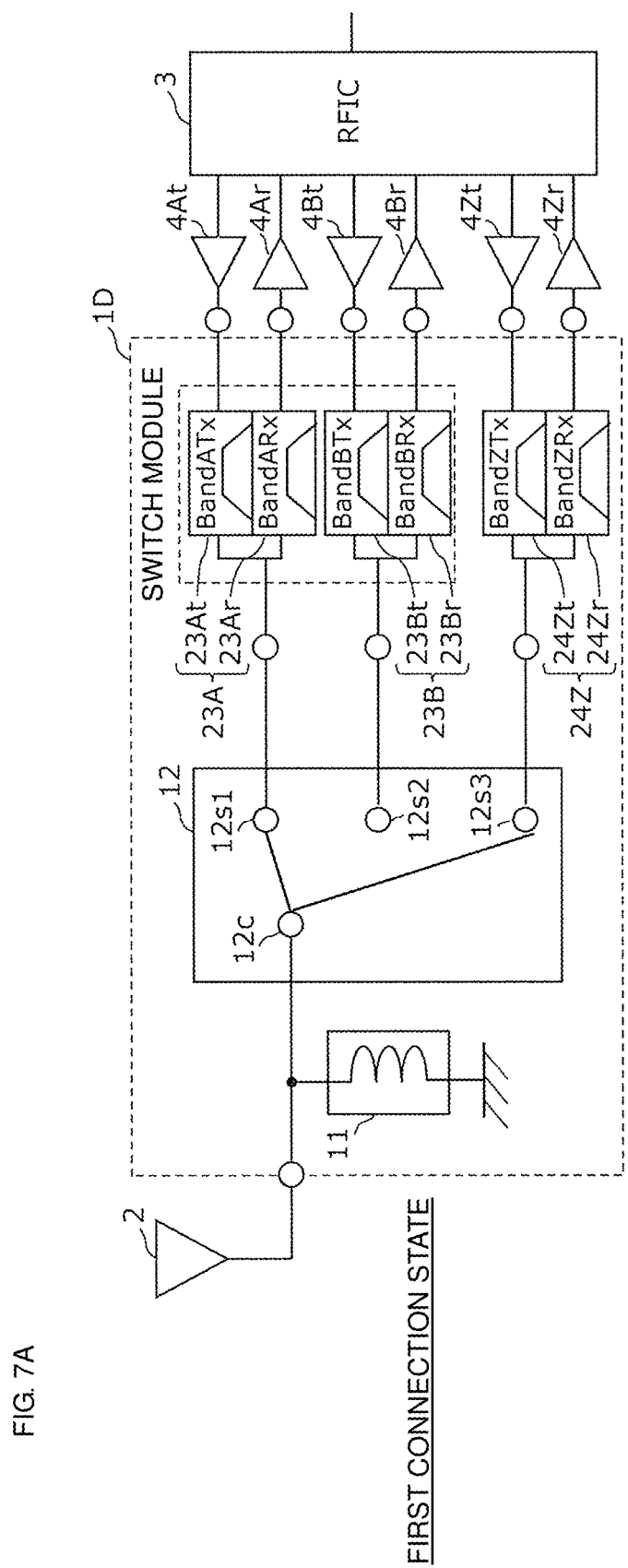
FIG. 7A is a circuit configuration diagram in a first connection state of a switch module according to an Example 4 of a preferred embodiment of the present invention.
Figure 7B:
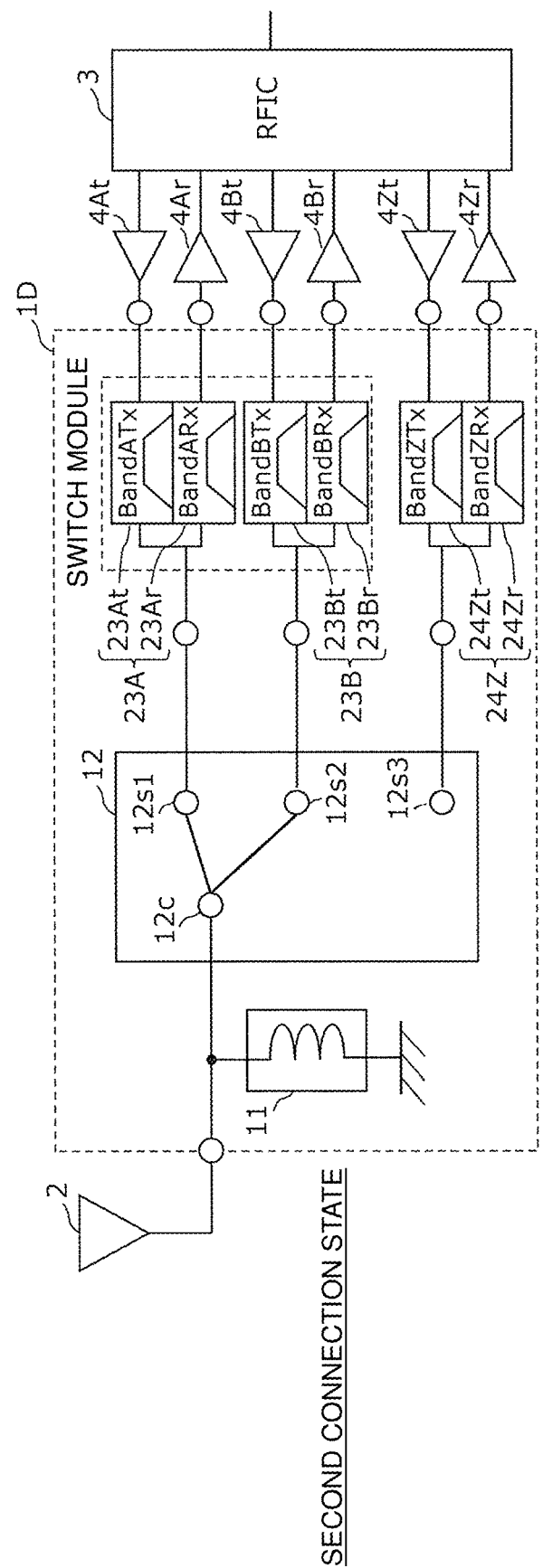
FIG. 7B is a circuit configuration diagram in a second connection state of the switch module according to the Example 4 of a preferred embodiment of the present invention.

FIG. 7A is a circuit configuration diagram in a first connection state of a switch module 1D according to an Example 4 of a preferred embodiment of the present invention. FIG. 7B is a circuit configuration diagram in a second connection state of the switch module 1D according to the Example 4. FIGS. 7A and 7B show the switch module 1D according to the Example 4, the antenna element 2, transmission signal amplifier circuits 4At, 4Bt, 4Zt, reception signal amplifier circuits 4Ar, 4Br, 4Zr, and the RF signal processing circuit 3. The switch module 1D, the antenna element 2, the transmission signal amplifier circuits 4At, 4Bt, 4Zt, and the reception signal amplifier circuits 4Ar, 4Br, 4Zr are disposed in, for example, a front-end portion of a cellular phone that supports multiband/multimode functionality. The switch module 1D according to this Example differs from the switch module 1A according to the Example 1 only in that the filters are replaced with duplexers. Hereinafter, for the switch module 1D according to this Example, the description of the same or similar points as those of the switch module 1A according to the Example 1 is omitted, and different points will be mainly described.

The switch module 1D includes the antenna matching circuit 11, the antenna switch 12, and duplexers 23A, 23B, 24Z.

The duplexer 23A is a first filter circuit (first duplexer) including a transmission filter 23At (first transmission filter) that transmits a signal of the first frequency band and a receiving filter 23Ar (first receiving filter) that receives a signal of the first frequency band. For example, Band 1 (transmission band: about 1920 MHz to about 1980 MHz, receiving band: about 2110 MHz to about 2170 MHz) of LTE is illustrated as the first frequency band.

The duplexer 23B is a second filter circuit (second duplexer) including a transmission filter 23Bt (second transmission filter) that transmits a signal of the second frequency band and a receiving filter 23Br (second receiving filter) that receives a signal of the second frequency band. For example, Band 3 (transmission band: about 1710 MHz to about 1785 MHz, receiving band: about 1805 MHz to about 1880 MHz) of LTE is illustrated as the second frequency band.

The duplexer 24Z is a third filter circuit (third duplexer) including a transmission filter 24Zt (third transmission filter) that transmits a signal of the third frequency band and a receiving filter 24Zr (third receiving filter) that receives a signal of the third frequency band. For example, Band 30 (transmission band: about 2305 MHz to about 2315 MHz, receiving band: about 2350 MHz to about 2360 MHz) of LTE is illustrated as the third frequency band.

The transmission signal amplifier circuit 4At is a power amplifier that amplifies the electric power of a radio-frequency transmission signal of the first frequency band (Band A). The transmission signal amplifier circuit 4Bt is a power amplifier that amplifies the electric power of a radio-frequency transmission signal of the second frequency band (Band B). The transmission signal amplifier circuit 4Zt is a power amplifier that amplifies the electric power of a radio-frequency transmission signal of the third frequency band (Band Z).

The reception signal amplifier circuit 4Ar is a low-noise amplifier that amplifies the electric power of a radio-frequency reception signal of the first frequency band (Band A). The reception signal amplifier circuit 4Br is a low-noise amplifier that amplifies the electric power of a radio-frequency reception signal of the second frequency band (Band B). The reception signal amplifier circuit 4Zr is a low-noise amplifier that amplifies the electric power of a radio-frequency reception signal of the third frequency band (Band Z).

With the above circuit configuration, the switch module 1D according to this Example is able to switch among at least (1) a first state (CA mode) where a radio-frequency transmission/reception signal of the first frequency band and a radio-frequency transmission/reception signal of the second frequency band are propagated in parallel, (2) a second state (non-CA mode) where, of a radio-frequency transmission/reception signal of the first frequency band and a radio-frequency transmission/reception signal of the second frequency band, only the radio-frequency transmission/reception signal of the first frequency band is propagated, and (3) a third state where a radio-frequency transmission/reception signal of the first frequency band and a radio-frequency transmission/reception signal of the second frequency band are not propagated and a radio-frequency transmission/reception signal of the third frequency band is propagated.

Switching of the antenna switch 12 among the first to third states is as shown in FIGS. 7A and 7B and is similar to that of the switch module 1A according to the Example 1.

With this configuration, in the second state (non-CA mode), not only the duplexer 23A but also the duplexer 24Z is connected to the common terminal 12c. Therefore, an impedance in the first frequency band of the duplexer 23A in the second state (non-CA mode) can be equalized or substantially equalized to (brought close to) an impedance in the first frequency band of the duplexer 23A in the first state (CA mode). Thus, even when the connection status of the antenna switch 12 is changed, a change in impedance at the common terminal 12c is reduced or prevented. Therefore, the degradation of insertion loss and return loss in the pass band of the duplexer 23A is reduced or prevented.

In the second state (non-CA mode), the duplexer 24Z that is used in the third state is used, such that no impedance matching circuit element in the first state or the second state is additionally required. Thus, space saving and miniaturization of the switch module 1D are possible.

In this Example, the duplexer 24Z is preferably, for example, a surface acoustic wave resonator that uses leaky waves that propagate in a piezoelectric layer made of $LiTaO_3$. The third frequency band is at frequencies higher than the first frequency band. The duplexer 24Z that uses leaky waves that propagate in a piezoelectric layer made of $LiTaO_3$ has characteristics such that a reflection coefficient in a lower frequency range than the pass band (third frequency band) is greater than a reflection coefficient in a higher frequency range than the pass band (a quality factor in a lower frequency range than the pass band is higher than a quality factor in a higher frequency range than the pass band). Therefore, by adjusting the lower frequency range of the duplexer 24Z to the first frequency band, an insertion loss in the first frequency band of the duplexer 23A in the second state (non-CA mode) is reduced or prevented.

A capacitance in the first frequency band when the duplexer 24Z alone is viewed from one end (input terminal) of the duplexer 24Z is equal or substantially equal to a capacitance in the first frequency band when the duplexer 23B alone is viewed from one end (input terminal) of the duplexer 23B.

A surface acoustic wave resonator that uses leaky waves that propagate in a piezoelectric layer made of $LiTaO_3$ has a capacitive impedance due to its structure. Thus, impedances can be equalized or substantially equalized to (brought close to) each other by equalizing or substantially equalizing (bringing) a capacitance in the first frequency band of the duplexer 23A in the second state (non-CA mode) to (close to) a capacitance in the first state (CA mode). Thus, an insertion loss in the first frequency band of the duplexer 23A is reduced regardless of whether the connection status is the first state or the second state.

8. Circuit Configuration of Switch Module 1E According to an Example 5

Figure 8A:
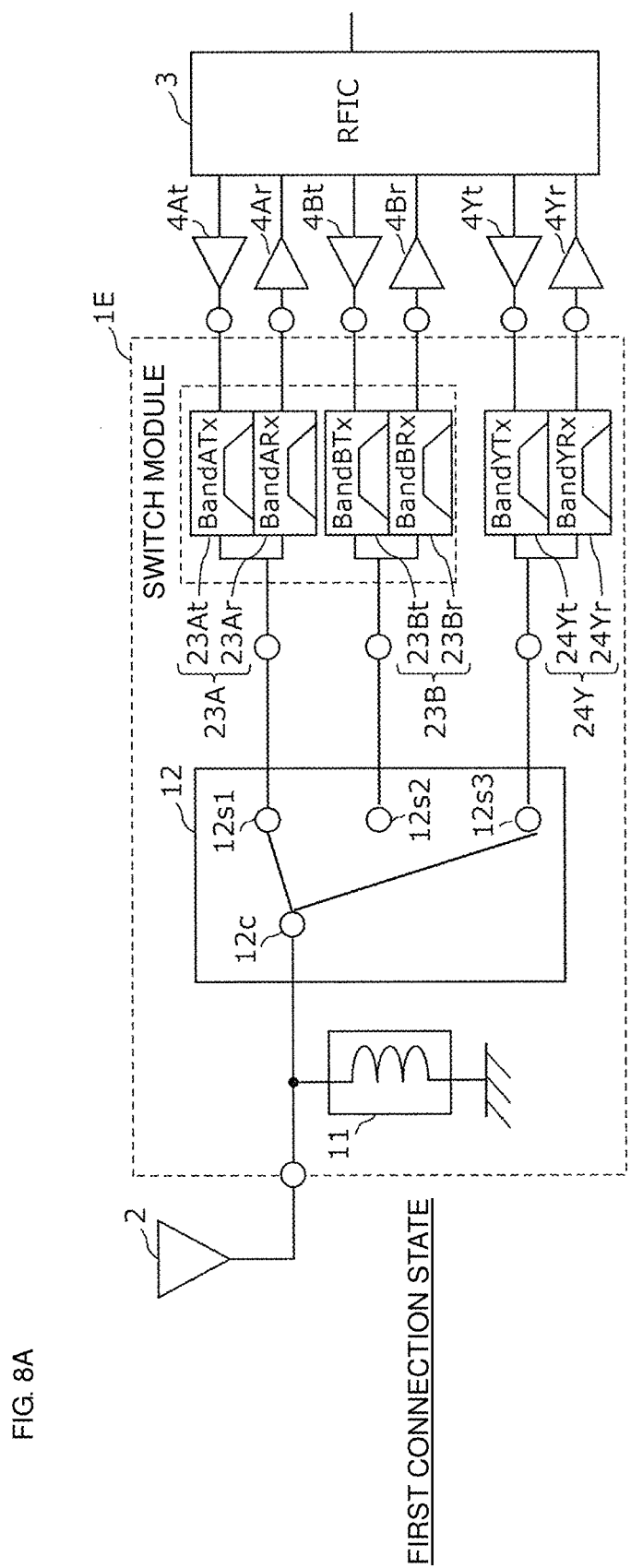
FIG. 8A is a circuit configuration diagram in a first connection state of a switch module according to an Example 5 of a preferred embodiment of the present invention.
Figure 8B:
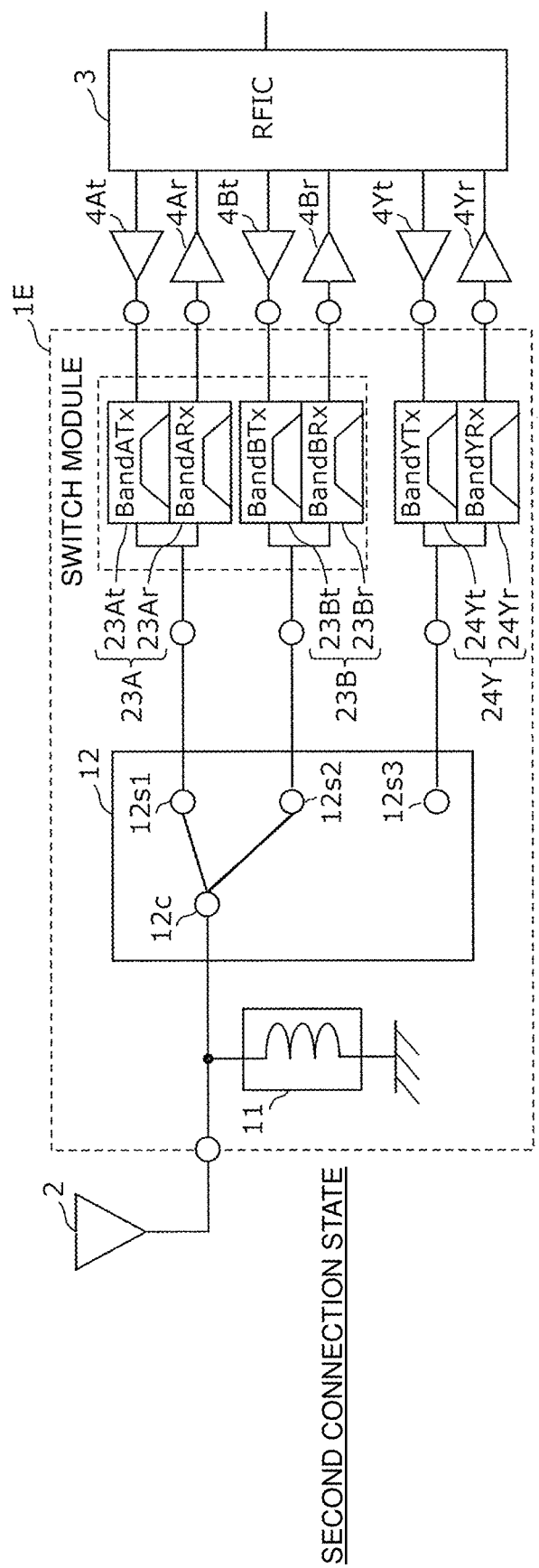
FIG. 8B is a circuit configuration diagram in a second connection state of the switch module according to the Example 5 of a preferred embodiment of the present invention.

FIG. 8A is a circuit configuration diagram in a first connection state of a switch module 1E according to an Example 5 of a preferred embodiment of the present invention. FIG. 8B is a circuit configuration diagram in a second connection state of the switch module 1E according to the Example 5. FIGS. 8A and 8B show the switch module 1E according to the Example 5, the antenna element 2, the transmission signal amplifier circuits 4At, 4Bt, a transmission signal amplifier circuit 4Yt, the reception signal amplifier circuits 4Ar, 4Br, a reception signal amplifier circuit 4Yr, and the RF signal processing circuit 3. The switch module 1E, the antenna element 2, the transmission signal amplifier circuits 4At, 4Bt, 4Yt, and the reception signal amplifier circuits 4Ar, 4Br, 4Yr are disposed in, for example, a front-end portion of a cellular phone that supports multi-band/multimode functionality. The switch module 1E according to this Example differs from the switch module 1D according to the Example 4 in only the configuration of a duplexer 24Y connected to the selection terminal 12s3. Hereinafter, for the switch module 1E according to this Example, the description of the same or similar points as those of the switch module 1D according to Example 4 is omitted, and different points will be mainly described.

The switch module 1E includes the antenna matching circuit 11, the antenna switch 12, and the duplexers 23A, 23B, 24Y.

The duplexer 24Y is a third filter circuit (third duplexer) including a transmission filter 24Yt (third transmission filter) that transmits a signal of the third frequency band and a receiving filter 24Yr (third receiving filter) that receives a signal of the third frequency band. For example, Band 25 (transmission band: about 1850 MHz to about 1915 MHz, receiving band: about 1930 MHz to about 1995 MHz) of LTE is illustrated as the third frequency band.

The transmission signal amplifier circuit 4Yt is a power amplifier that amplifies the electric power of a radio-frequency transmission signal of the third frequency band (Band Y).

The reception signal amplifier circuit 4Yr is a low-noise amplifier that amplifies the electric power of a radio-frequency reception signal of the third frequency band (Band Y).

With the above circuit configuration, the switch module 1E according to this Example is able to switch among at least (1) a first state (CA mode) where a radio-frequency transmission/reception signal of the first frequency band and a radio-frequency transmission/reception signal of the second frequency band are propagated in parallel, (2) a second state (non-CA mode) where, of a radio-frequency transmission/reception signal of the first frequency band and a radio-frequency transmission/reception signal of the second frequency band, only the radio-frequency transmission/reception signal of the first frequency band is propagated, and (3) a third state where a radio-frequency transmission/reception signal of the first frequency band and a radio-frequency transmission/reception signal of the second frequency band are not propagated and a radio-frequency transmission/reception signal of the third frequency band is propagated.

Switching of the antenna switch 12 among the first to third states is as shown in FIGS. 8A and 8B and is similar to that of the switch module 1B according to Example 2.

With this configuration, even when the connection status of the antenna switch 12 is changed, a change in impedance at the common terminal 12c is reduced or prevented. Thus, the degradation of insertion loss and return loss in the pass band of the duplexer 23A is reduced or prevented.

In the second state (non-CA mode), the duplexer 24Y that is used in the third state is used, such that no impedance matching circuit element in the first state or the second state is additionally required. Thus, space saving and miniaturization of the switch module 1E are possible.

In this Example, the duplexer 24Y is preferably, for example, a surface acoustic wave resonator that uses Rayleigh waves that propagate in a piezoelectric layer made of $LiNbO_3$ or an acoustic wave resonator that uses bulk waves. The third frequency band lies between the first frequency band and the second frequency band. The duplexer 24Y that is a surface acoustic wave resonator that uses Rayleigh waves that propagate in a piezoelectric layer made of $LiNbO_3$ or an acoustic wave resonator that uses bulk waves has characteristics such that a reflection coefficient in both the higher frequency range and lower frequency range is greater than a reflection coefficient in the pass band (third frequency band) (a quality factor in both the higher frequency range and lower frequency range is higher than a quality factor in the pass band (third frequency band)). Therefore, by adjusting the stop band of the duplexer 24Y to the first frequency band, an insertion loss in the first frequency band of the duplexer 23A in the second state (non-CA mode) is reduced or prevented.

A capacitance in the first frequency band when the duplexer 24Y alone is viewed from one end (input terminal) of the duplexer 24Y is equal or substantially equal to a capacitance in the first frequency band when the duplexer 23B alone is viewed from one end (input terminal) of the duplexer 23B.

A surface acoustic wave resonator that uses Rayleigh waves that propagate in a piezoelectric layer made of $LiNbO_3$ or an acoustic wave resonator that uses bulk waves has a capacitive impedance from its structure. Thus, impedances can be equalized or substantially equalized to (brought close to) each other by equalizing or substantially equalizing (bringing) a capacitance in the first frequency band of the duplexer 23A in the second state (non-CA mode) to (close to) a capacitance in the first state (CA mode). Thus, an insertion loss in the first frequency band of the duplexer 23A is reduced regardless of whether the connection status is the first state or the second state.

9. Circuit Configuration of Switch Module 1F According to an Example 6

Figure 9B:
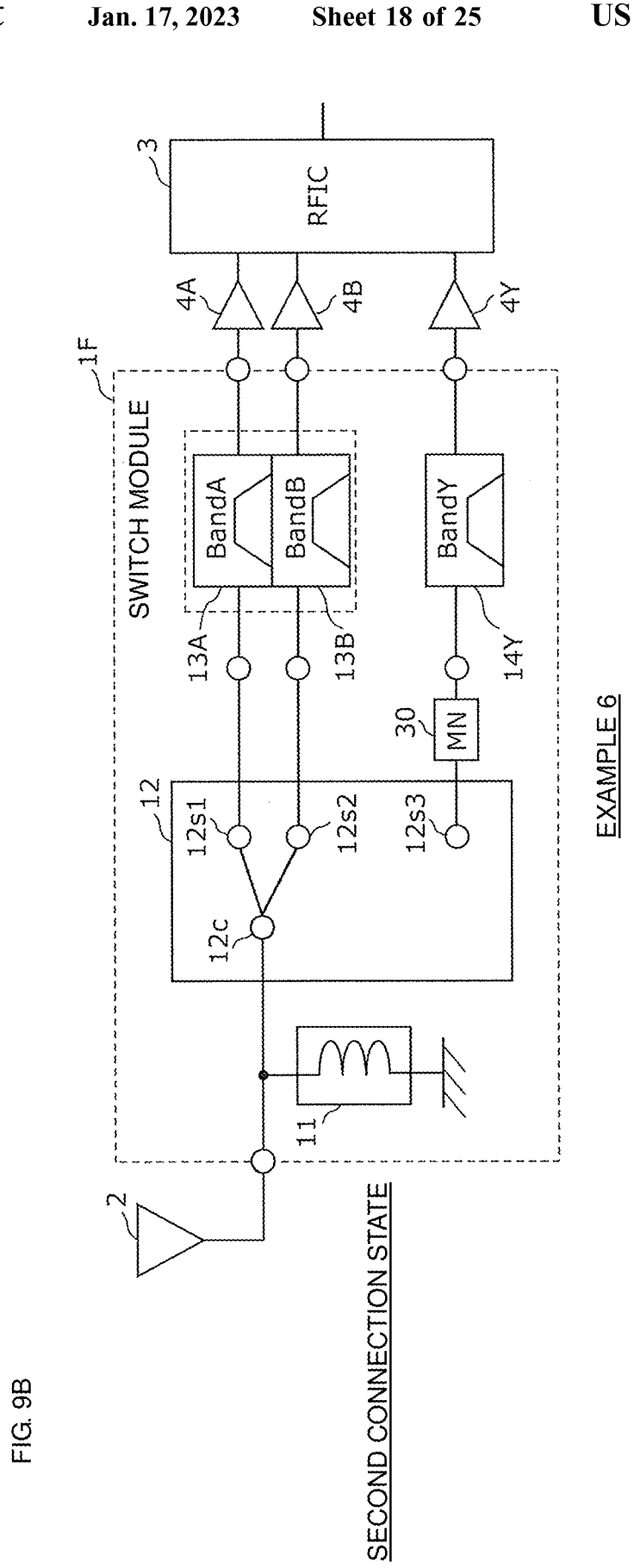
FIG. 9B is a circuit configuration diagram in a second connection state of the switch module according to the Example 6 of a preferred embodiment of the present invention.

FIG. 9A is a circuit configuration diagram in a first connection state of a switch module 1F according to an Example 6 of a preferred embodiment of the present invention. FIG. 9B is a circuit configuration diagram in a second connection state of the switch module 1F according to the Example 6. FIGS. 9A and 9B show the switch module 1F according to the Example 6, the antenna element 2, the reception signal amplifier circuits 4A, 4B, 4Y, and the RF signal processing circuit 3. The switch module 1F, the antenna element 2, and the reception signal amplifier circuits 4A, 4B, 4Y are disposed in, for example, a front-end portion of a cellular phone that supports multiband/multimode functionality.

The switch module 1F according to this Example differs from the switch module 1B according to the Example 2 in that an impedance matching circuit 30 is additionally disposed between the selection terminal 12s3 and the filter 14Y. Hereinafter, for the switch module 1F according to this Example, the description of the same or similar points as those of the switch module 1B according to the Example 2 is omitted, and different points will be mainly described.

In this Example, a filter that selectively passes an RF reception signal of Band 1 (first frequency band: receiving band: about 2110 MHz to about 2170 MHz) of LTE is applied as the filter 13A. A filter that selectively passes an RF reception signal of Band 3 (second frequency band: receiving band: about 1805 MHz to about 1880 MHz) of LTE is applied as the filter 13B. A filter that selectively passes an RF reception signal in Band 30 (third frequency band: receiving band: about 2350 MHz to about 2360 MHz) of LTE is applied as the filter 14X.

The impedance matching circuit 30 is connected to a signal path connecting the filter 14Y and the selection terminal 12s3. The impedance matching circuit 30 has a function of highly accurately matching an impedance in the first frequency band when the filter 14Y alone is viewed from the selection terminal 12s3 with an impedance in the first frequency band when the filter 13B alone is viewed from one end of the filter 13B.

Figure 10:
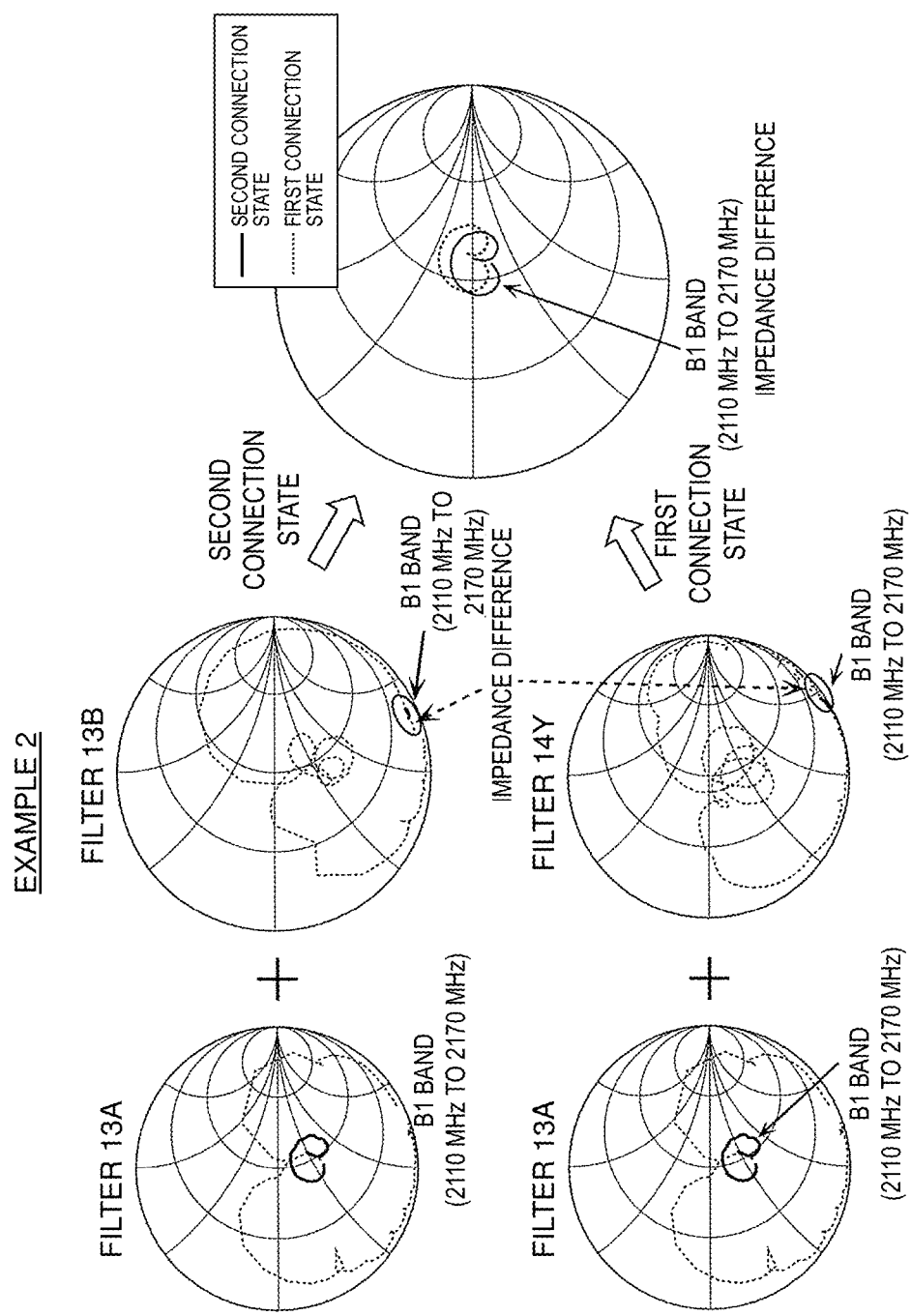
FIG. 10 shows Smith charts that illustrate a difference in impedance between the first connection state and second connection state of the switch module according to the Example 2 of a preferred embodiment of the present invention.

FIG. 10 shows Smith charts that illustrate a difference in impedance between the first connection state and second connection state of the switch module 1B according to the Example 2. In the switch module 1B according to the Example 2, an impedance in Band 1 of the filter 13B alone, viewed from the input terminal of the filter 13B (the Smith chart at the top center in FIG. 10), and an impedance in Band 1 of the filter 14Y alone, viewed from the input terminal of the filter 14Y (the Smith chart at the bottom center in FIG. 10), each is in an outer peripheral range (high resistance range) of the Smith chart. However, an impedance in Band 1 of the filter 13B alone, viewed from the input terminal of the filter 13B, is on a slightly lower impedance side as compared to an impedance in Band 1 of the filter 14Y alone, viewed from the input terminal of the filter 14Y. This impedance difference between the filter 13B and the filter 14Y causes an impedance difference between an impedance in Band 1 viewed from the input terminal of the filter 13A in the second connection state and an impedance in Band 1 viewed from the input terminal of the filter 13A in the first connection state (the Smith chart at the right side in FIG. 10). In the switch module 1B according to the Example 2, even when the connection status is changed between the second connection state and the first connection state, a change in impedance at the common terminal is reduced, such that the degradation of insertion loss and return loss in the pass band of the filter 13A is reduced. However, there is still a difference in insertion loss and return loss in the pass band of the filter 13A between the second connection state and the first connection state because of the above-described impedance difference.

In contrast to this, in the switch module 1F according to this Example, an impedance in Band 1 of the filter 14Y alone, viewed from the selection terminal 12s3 of the filter 14Y, can be shifted by the impedance matching circuit 30 disposed in a stage preceding to the filter 14Y. With this configuration, by changing the connection status between the first connection state and the second connection state, a change in impedance at the common terminal is highly accurately reduced, so the degradation of insertion loss and return loss in the pass band of the filter 13A is highly accurately reduced.

Figure 11A:
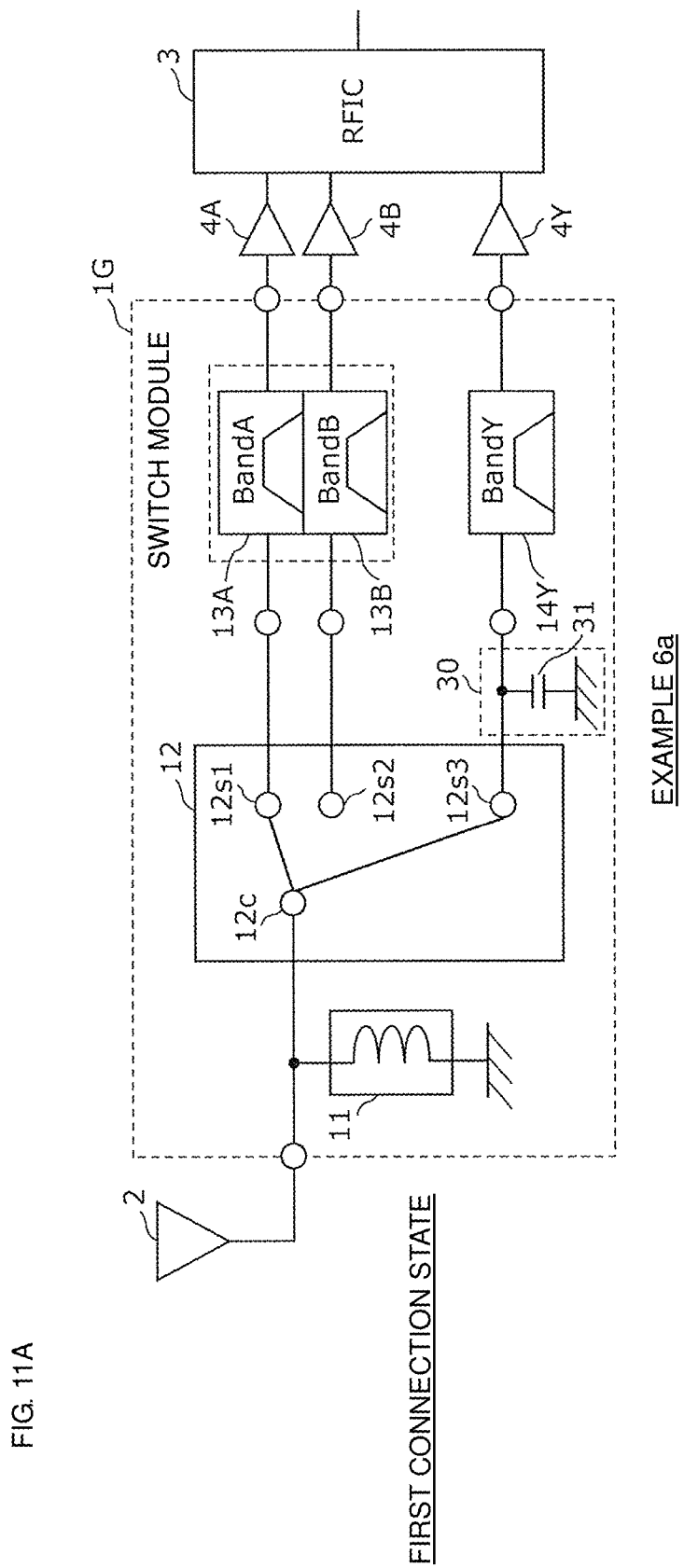
FIG. 11A is a circuit configuration diagram in a first connection state of a switch module according to an Example 6a of a preferred embodiment of the present invention.
Figure 11B:
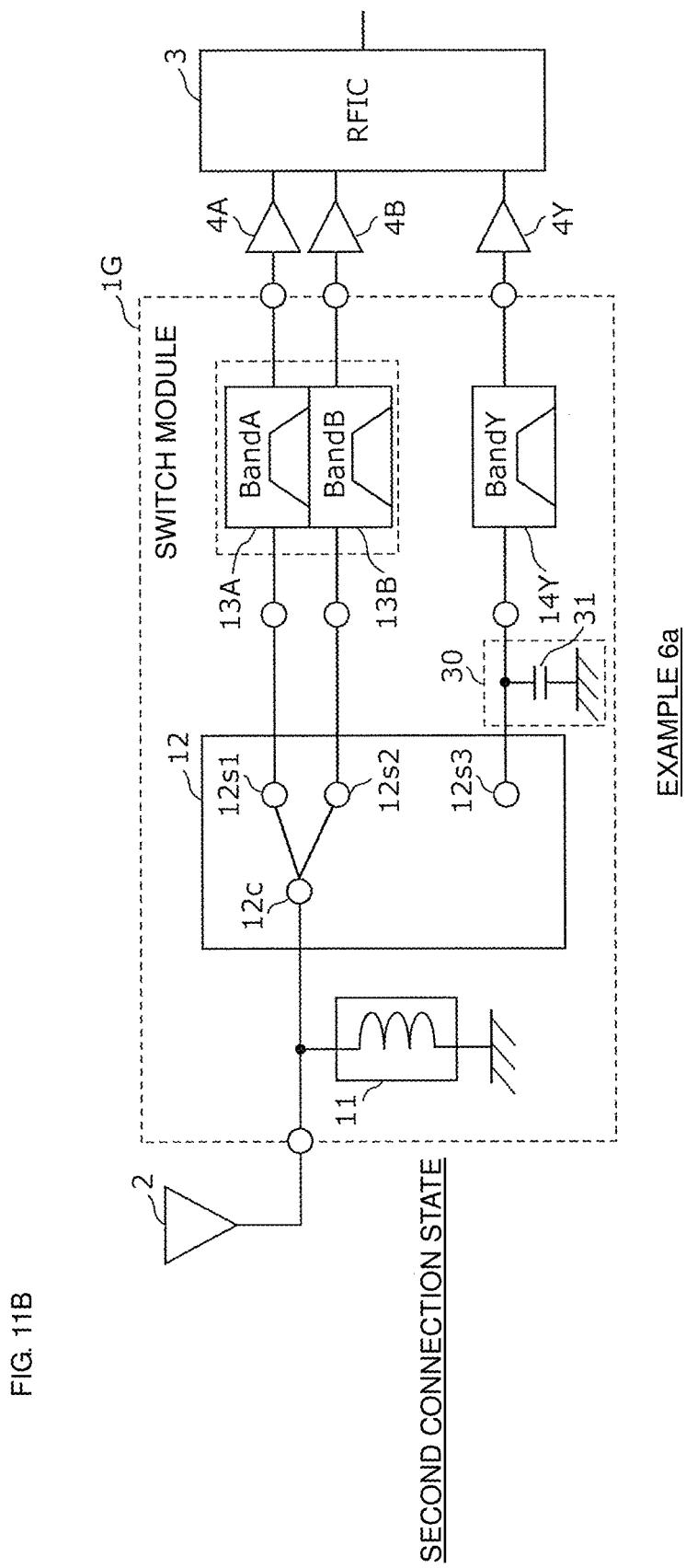
FIG. 11B is a circuit configuration diagram in a second connection state of the switch module according to an Example 6a of a preferred embodiment of the present invention.

FIG. 11A is a circuit configuration diagram in a first connection state of a switch module 1G according to an Example 6a of a preferred embodiment of the present invention. FIG. 11B is a circuit configuration diagram in a second connection state of the switch module 1G according to the Example 6a. FIGS. 11A and 11B show the switch module 1G according to the Example 6a, the antenna element 2, the reception signal amplifier circuits 4A, 4B, 4Y, and the RF signal processing circuit 3.

The switch module 1G according to this Example is a specific example of the switch module 1F according to the Example 6, and the specific circuit configuration of the impedance matching circuit 30 is shown. Hereinafter, for the switch module 1G according to this Example, the description of the same or similar points as those of the switch module 1F according to Example 6 is omitted, and different points will be mainly described.

The impedance matching circuit 30 includes a capacitor 31 connected between a ground and a signal path connecting the selection terminal 12s3 and the input terminal of the filter 14Y.

Figure 12:
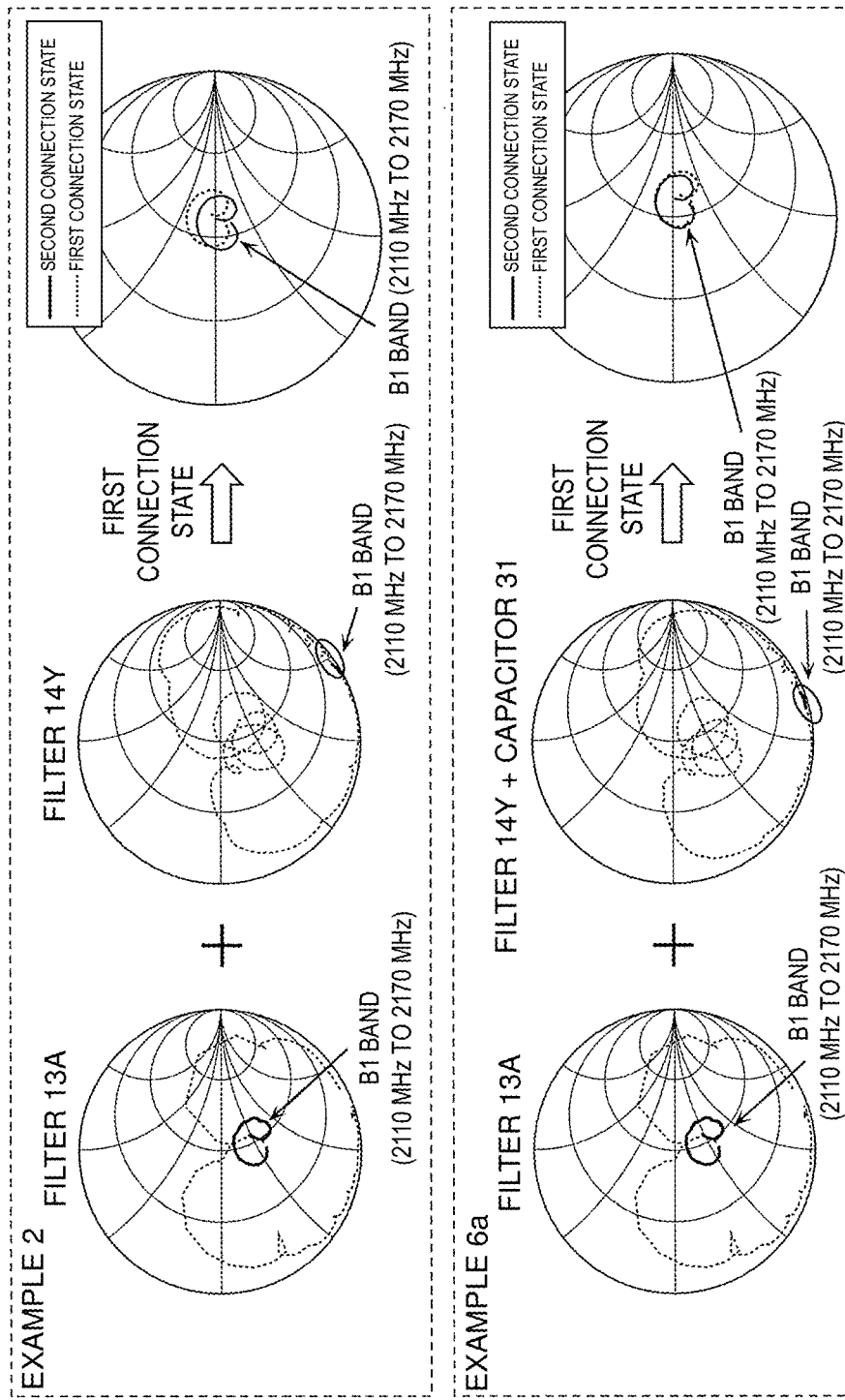
FIG. 12 shows Smith charts that illustrate a difference in impedance between the first connection state and second connection state of each of the switch module according to Example 2 and the switch module according to the Example 6a of a preferred embodiment of the present invention.

FIG. 12 shows Smith charts that illustrate a difference in impedance between the first connection state and second connection state of each of the switch module according to the Example 2 and the switch module according to the Example 6a. In the switch module 1B according to the Example 2, as shown in FIG. 10, an impedance in Band 1 of the filter 14Y alone, viewed from the input terminal of the filter 14Y, is on a slightly higher impedance side as compared to an impedance in Band 1 of the filter 13B alone, viewed from the input terminal of the filter 13B (the Smith chart at the top center in FIG. 12).

In contrast to this, in the switch module 1G according to the Example 6a, an impedance in Band 1 of the filter 14Y alone, viewed from the selection terminal 12s3 of the filter 14Y, shifts in a clockwise direction on a constant conductance circle because of the capacitor 31 connected in parallel between the signal path and the ground. For this reason, an impedance in Band 1 of the filter 14Y, viewed from the selection terminal 12s3 of the filter 14Y, shifts slightly toward a lower impedance side and gets close to an impedance in Band 1 of the filter 13B alone, viewed from the input terminal of the filter 13B (the Smith chart at the bottom center in FIG. 12).

With this configuration, even when the connection status is changed between the second connection state and the first connection state, a change in impedance in Band 1 at the common terminal is highly accurately reduced, so the degradation of insertion loss and return loss in the pass band of the filter 13A is highly accurately reduced.

Figure 13A:
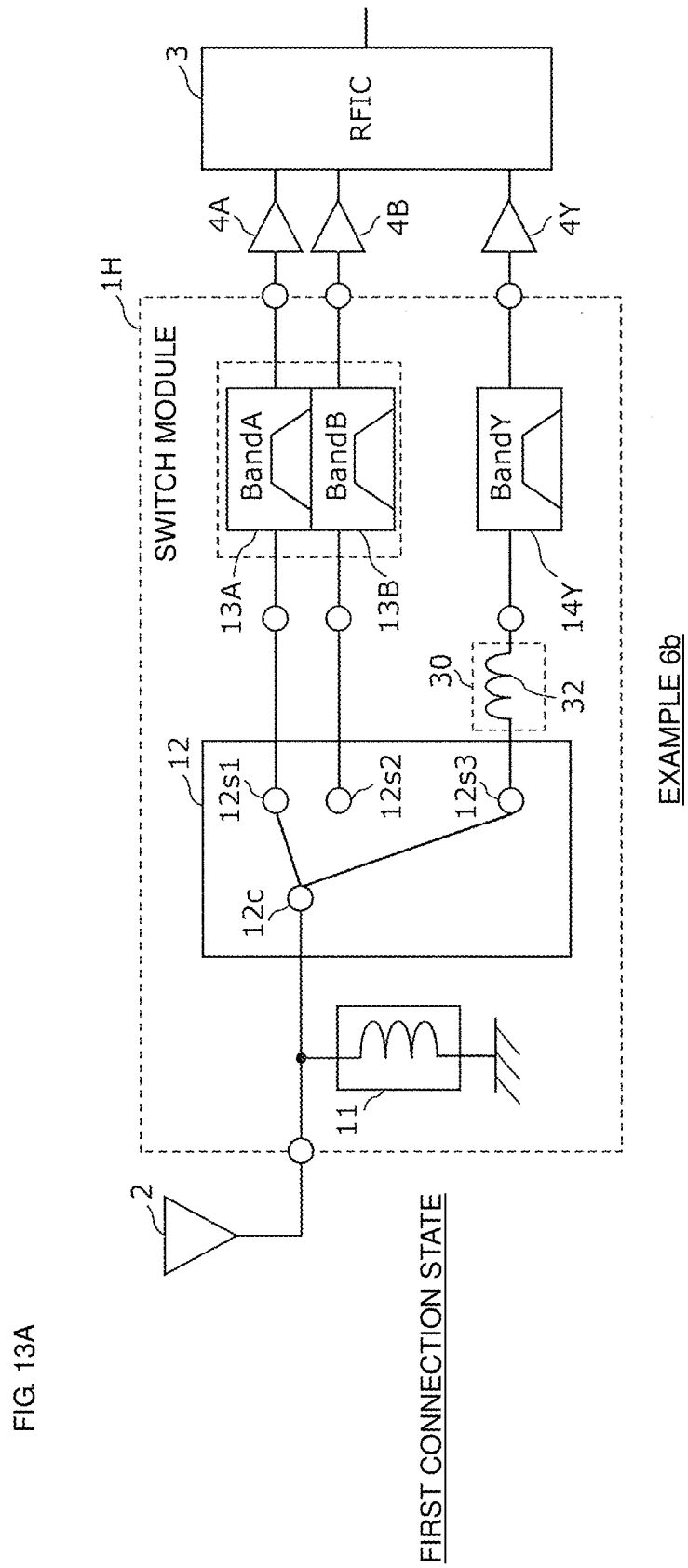
FIG. 13A is a circuit configuration diagram in a first connection state of a switch module according to an Example 6b of a preferred embodiment of the present invention.
Figure 13B:
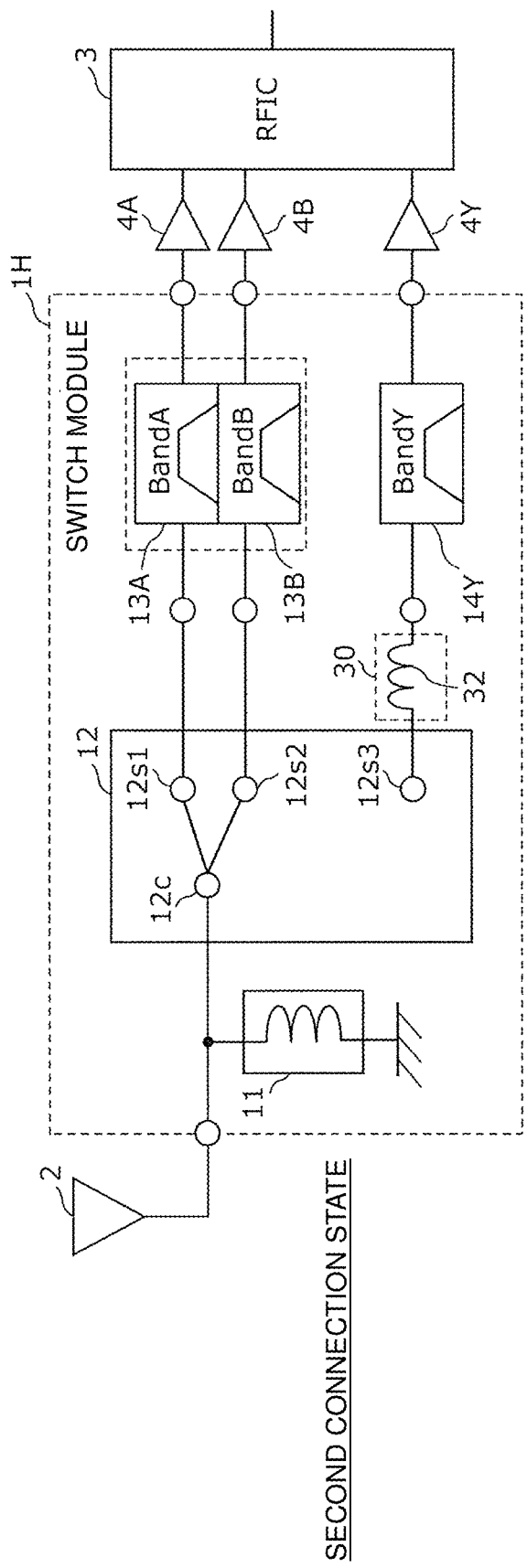
FIG. 13B is a circuit configuration diagram in a second connection state of the switch module according to the Example 6b of a preferred embodiment of the present invention.

FIG. 13A is a circuit configuration diagram in a first connection state of a switch module 1H according to an Example 6b of a preferred embodiment of the present invention. FIG. 13B is a circuit configuration diagram in a second connection state of the switch module 1H according to the Example 6b. FIGS. 13A and 13B show the switch module 1H according to the Example 6b, the antenna element 2, the reception signal amplifier circuits 4A, 4B, 4Y, and the RF signal processing circuit 3.

The switch module 1H according to this Example is a specific example of the switch module 1F according to the Example 6, and the specific circuit configuration of the impedance matching circuit 30 is shown. Hereinafter, for the switch module 1H according to this Example, the description of the same or similar points as those of the switch module 1F according to the Example 6 is omitted, and different points will be mainly described.

The impedance matching circuit 30 includes an inductor 32 connected between the input terminal (one end) of the filter 14Y and the selection terminal 12s3. In other words, the inductor 32 is disposed in series with the signal path connecting the input terminal (one end) of the filter 14Y and the selection terminal 12s3.

Figure 14:
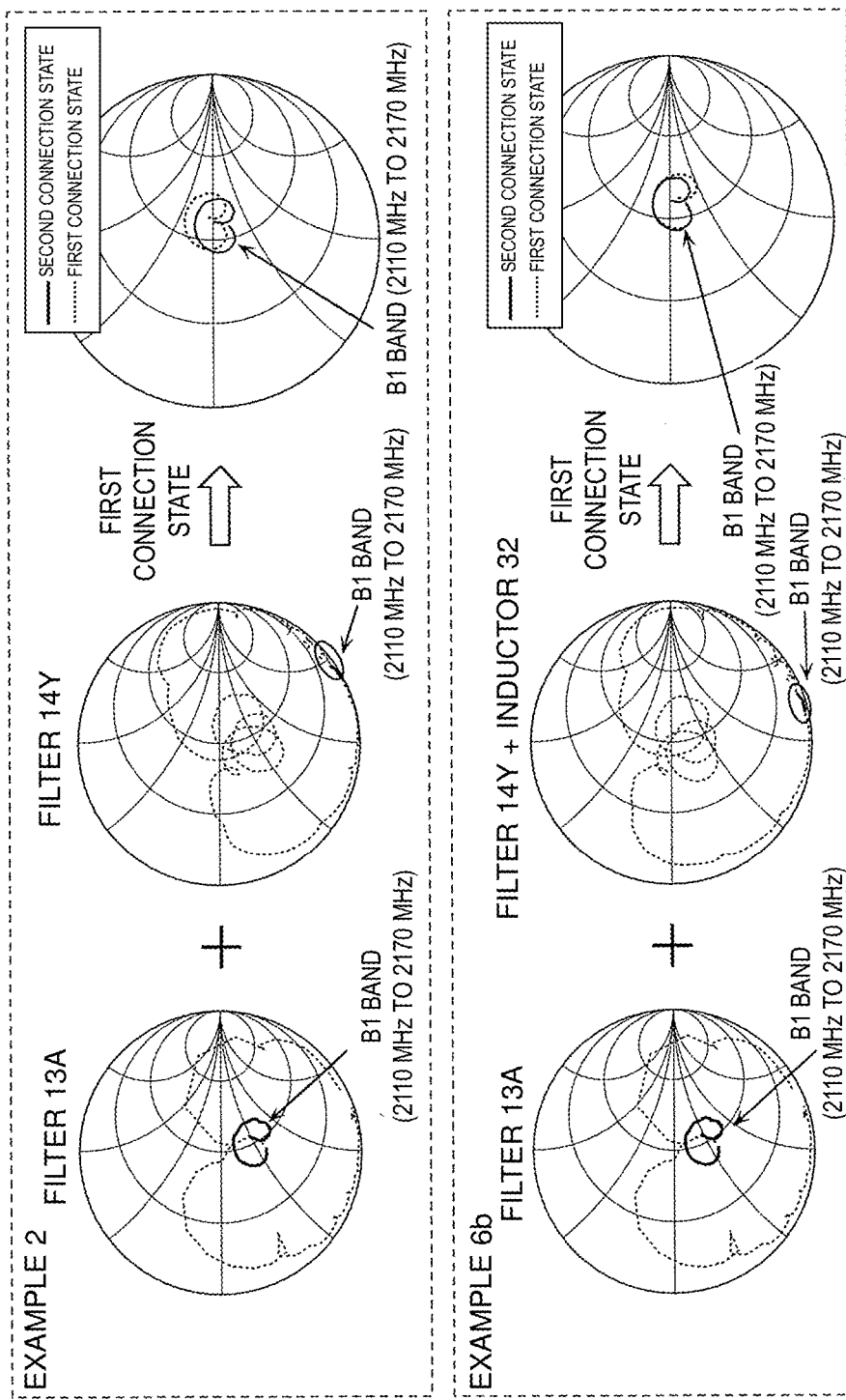
FIG. 14 shows Smith charts that illustrate a difference in impedance between the first connection state and second connection state of each of the switch module according to the Example 2 of a preferred embodiment of the present invention and the switch module according to the Example 6b of a preferred embodiment of the present invention.

FIG. 14 shows Smith charts that illustrate a difference in impedance between the first connection state and second connection state of each of the switch module according to the Example 2 and the switch module according to the Example 6b. In the switch module 1B according to the Example 2, as shown in FIG. 10, an impedance in Band 1 of the filter 14Y alone, viewed from the input terminal of the filter 14Y, is on a slightly higher impedance side as compared to an impedance in Band 1 of the filter 13B alone, viewed from the input terminal of the filter 13B (the Smith chart at the top center in FIG. 12).

In contrast to this, in the switch module 1H according to the Example 6b, an impedance in Band 1 of the filter 14Y alone, viewed from the selection terminal 12s3 of the filter 14Y, shifts in a clockwise direction on a constant resistance circle because of the inductor 32 connected in series ton the signal path. For this reason, an impedance in Band 1 of the filter 14Y, viewed from the selection terminal 12s3 of the filter 14Y, shifts slightly toward a lower impedance side and gets close to an impedance in Band 1 of the filter 13B alone, viewed from the input terminal of the filter 13B (the Smith chart at the bottom center in FIG. 14).

With this configuration, even when the connection status is changed between the second connection state and the first connection state, a change in impedance in Band 1 at the common terminal is highly accurately reduced, so the degradation of insertion loss and return loss in the pass band of the filter 13A is highly accurately reduced.

The switch modules according to preferred embodiments of the present invention are described by way of Examples. However, the switch modules of preferred embodiments of the present invention are not limited to the Examples. The present invention also encompasses other preferred embodiments obtained by combining selected elements of the above-described Examples, modifications obtained by applying various alterations that are conceived of by persons skilled in the art to the above-described Examples without departing from the scope of the present invention, and various devices that include the switch module of the present disclosure.

The switch controllers according to preferred embodiments of the present invention may be used as an IC that is an integrated circuit, or an LSI (large scale integration). A method of integrating circuits may be provided by an exclusive circuit or a general-purpose processor. A reconfigurable processor that, after manufacturing of LSI, allows reconfiguration of FPGA (field programmable gate array)

that is programmable or connection or setting of circuit cells inside the LSI may be used. Furthermore, if a circuit integration technology that replaces LSI with another technology resulting from the progress or derivative of a semiconductor technology is developed, the technology may be used to integrate functional blocks.

In the switch modules according to the above preferred embodiments, another radio-frequency circuit element, wire, or the like, may be inserted in paths connecting circuit elements and signal paths, disclosed in the drawings.

Preferred embodiments of the present invention are widely usable in communication equipment, such as cellular phones, for example, as a switch module that supports multimode/multiband functionality and that employs carrier aggregation mode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch module that is able to switch among a first state where a radio-frequency signal of a first frequency band and a radio-frequency signal of a second frequency band different in frequency band from the first frequency band are propagated in parallel, a second state where, of the radio-frequency signal of the first frequency band and the radio-frequency signal of the second frequency band, only a radio-frequency signal of the first frequency band is propagated, and a third state where the radio-frequency signal of the first frequency band and the radio-frequency signal of the second frequency band are not propagated and a radio-frequency signal of a third frequency band different in frequency band from the first frequency band or the second frequency band is propagated, the switching module comprising:
    a first filter circuit to selectively pass the radio-frequency signal of the first frequency band;
    a second filter circuit to selectively pass the radio-frequency signal of the second frequency band;
    a third filter circuit to selectively pass the radio-frequency signal of the third frequency band; and
    a switch circuit including a common terminal, a first selection terminal connected to one end of the first filter circuit, a second selection terminal connected to one end of the second filter circuit, and a third selection terminal connected to one end of the third filter circuit, the switch circuit being structured to switch connection of at least one of the first selection terminal, the second selection terminal, and the third selection terminal with the common terminal; wherein
    in the first state, the common terminal and the first selection terminal are connected, the common terminal and the second selection terminal are connected, and the common terminal and the third selection terminal are not connected;
    the second state is a non-carrier aggregation mode; and
    in the second state, the common terminal and the first selection terminal are connected, the common terminal and the second selection terminal are not connected, and the common terminal and the third selection terminal are connected.

2. The switch module according to claim 1, further comprising:
    an impedance matching circuit connected to a signal path connecting the third filter circuit and the third selection terminal; wherein
    the impedance matching circuit is structured to match an impedance in the first frequency band when the third filter circuit alone is viewed from the third selection terminal with an impedance in the first frequency band when the second filter circuit alone is viewed from the one end of the second filter circuit.

3. The switch module according to claim 2, wherein the impedance matching circuit includes a capacitor connected between the signal path and a ground.

4. The switch module according to claim 2, wherein the impedance matching circuit includes an inductor connected between the one end of the third filter circuit and the third selection terminal.

5. The switch module according to claim 1, wherein
    the third filter circuit is a surface acoustic wave resonator that uses leaky waves that propagate in a piezoelectric layer made of $LiTaO_3$; and
    the third frequency band is at frequencies higher than the first frequency band.

6. The switch module according to claim 5, wherein a capacitance in the first frequency band when the third filter circuit alone is viewed from the one end of the third filter circuit is equal or substantially equal to a capacitance in the first frequency band when the second filter circuit alone is viewed from the one end of the second filter circuit.

7. The switch module according to claim 1, wherein an impedance in the first frequency band when the third filter circuit alone is viewed from the one end of the third filter circuit is equal or substantially equal to an impedance in the first frequency band when the second filter circuit alone is viewed from the one end of the second filter circuit.

8. The switch module according to claim 1, wherein the third filter circuit is a surface acoustic wave resonator that uses Rayleigh waves that propagate in a piezoelectric layer made of $LiNbO_3$ or a bulk acoustic wave resonator that uses bulk waves.

9. The switch module according to claim 1, further comprising:
    a switch controller to receive selection information of a frequency band to be used for wireless communication and output a control signal based on the selection information to the switch circuit; wherein
    the switch controller is configured or programmed to, by outputting the control signal to the switch circuit:
        in the first state, cause the common terminal and the first selection terminal to be connected, cause the common terminal and the second selection terminal to be connected, and cause the common terminal and the third selection terminal to be disconnected; and
        in the second state, cause the common terminal and the first selection terminal to be connected, cause the common terminal and the second selection terminal to be disconnected, and cause the common terminal and the third selection terminal to be connected.

10. The switch module according to claim 1, wherein the first state is a carrier aggregation mode.

11. The switch module according to claim 1, wherein
    the first filter circuit is a first duplexer including a first transmission filter to transmit a signal of the first frequency band and a first receiving filter to receive a signal of the first frequency band;
    the second filter circuit is a second duplexer including a second transmission filter to transmit a signal of the second frequency band and a second receiving filter to receive a signal of the second frequency band; and the third filter circuit is a third duplexer including a third transmission filter to transmit a signal of the third frequency band and a third receiving filter to receive a signal of the third frequency band.

12. A switch module that is able to switch among a first state where a radio-frequency signal of a first frequency band, a radio-frequency signal of a second frequency band different in frequency band from the first frequency band, and a radio-frequency signal of a third frequency band different in frequency band from the first frequency band or the second frequency band are propagated in parallel, a second state where, of the first frequency band, the second frequency band, and the third frequency band, only the radio-frequency signal of the second frequency band and the radio-frequency signal of the third frequency band are propagated in parallel, a third state where, of the first frequency band, the second frequency band, and the third frequency band, only the radio-frequency signal of the first frequency band and the radio-frequency signal of the third frequency band are propagated in parallel, a fourth state where, of the first frequency band, the second frequency band, and the third frequency band, only the radio-frequency signal of the third frequency band is propagated, a fifth state where the radio-frequency signal of the first frequency band, the radio-frequency signal of the second frequency band, and the radio-frequency signal of the third frequency band are not propagated and a radio-frequency signal of a fourth frequency band different in frequency band from the first frequency band, the second frequency band, or the third frequency band is propagated, and a sixth state where the radio-frequency signal of the first frequency band, the radio-frequency signal of the second frequency band, and the radio-frequency signal of the third frequency band are not propagated and a radio-frequency signal of a fifth frequency band different in frequency band from the first frequency band, the second frequency band, the third frequency band, or the fourth frequency band is propagated, the switch module comprising:

a first filter circuit to selectively pass a radio-frequency signal of the first frequency band;

a second filter circuit to selectively pass a radio-frequency signal of the second frequency band;

a third filter circuit to selectively pass a radio-frequency signal of the third frequency band;

a fourth filter circuit to selectively pass a radio-frequency signal of the fourth frequency band;

a fifth filter circuit to selectively pass a radio-frequency signal of the fifth frequency band; and a switch circuit including a common terminal, a first selection terminal connected to one end of the first filter circuit, a second selection terminal connected to one end of the second filter circuit, a third selection terminal connected to one end of the third filter circuit, a fourth selection terminal connected to one end of the fourth filter circuit, and a fifth selection terminal connected to one end of the fifth filter circuit, the switch circuit being structured to switch connection of at least one of the first selection terminal, the second selection terminal, the third selection terminal, the fourth selection terminal, and the fifth selection terminal with the common terminal; wherein in the first state, the common terminal and the first selection terminal are connected, the common terminal and the second selection terminal are connected, the common terminal and the third selection terminal are connected, the common terminal and the fourth selection terminal are not connected, and the common terminal and the fifth selection terminal are not connected;

in the second state, the common terminal and the first selection terminal are not connected, the common terminal and the second selection terminal are connected, the common terminal and the third selection terminal are connected, the common terminal and the fourth selection terminal are connected, and the common terminal and the fifth selection terminal are not connected;

in the third state, the common terminal and the first selection terminal are connected, the common terminal and the second selection terminal are not connected, the common terminal and the third selection terminal are connected, the common terminal and the fourth selection terminal are not connected, and the common terminal and the fifth selection terminal are connected;

the fourth state is a non-carrier aggregation mode; and in the fourth state, the common terminal and the first selection terminal are not connected, the common terminal and the second selection terminal are not connected, the common terminal and the third selection terminal are connected, the common terminal and the fourth selection terminal are connected, and the common terminal and the fifth selection terminal are connected.

13. The switch module according to claim 12, wherein an impedance in the second frequency band when the fourth filter circuit alone is viewed from the one end of the fourth filter circuit is equal or substantially equal to an impedance in the second frequency band when the first filter circuit alone is viewed from the one end of the first filter circuit.

14. The switch module according to claim 12, wherein an impedance in the third frequency band when the fourth filter circuit alone is viewed from the one end of the fourth filter circuit is equal or substantially equal to an impedance in the third frequency band when the first filter circuit alone is viewed from the one end of the first filter circuit.

15. The switch module according to claim 12, wherein an impedance in the first frequency band when the fifth filter circuit alone is viewed from the one end of the fifth filter circuit is equal or substantially equal to an impedance in the first frequency band when the second filter circuit alone is viewed from the one end of the second filter circuit.

16. The switch module according to claim 12, wherein an impedance in the third frequency band when the fifth filter circuit alone is viewed from the one end of the fifth filter circuit is equal or substantially equal to an impedance in the third frequency band when the second filter circuit alone is viewed from the one end of the second filter circuit.

17. The switch module according to claim 12, wherein an impedance in the third frequency band when a parallel circuit of the fourth and fifth filter circuits is viewed from the one ends of the fourth and fifth filter circuits is equal or substantially equal to an impedance in the third frequency band when a parallel circuit of the first and second filter circuits is viewed from the one ends of the first and second filter circuits.

18. The switch module according to claim 12, wherein the fourth filter circuit is a surface acoustic wave resonator that uses leaky waves that propagate in a piezoelectric layer made of $LiTaO_3$.

19. The switch module according to claim 12, wherein the fifth filter circuit is a surface acoustic wave resonator that uses Rayleigh waves that propagate in a piezoelectric layer made of LiNbO$_3$ or an acoustic wave resonator that uses bulk waves.

20. A switch module that is able to switch among a first state where a radio-frequency signal of a first frequency band and a radio-frequency signal of a second frequency band different in frequency band from the first frequency band are propagated in parallel, a second state where, of the radio-frequency signal of the first frequency band and the radio-frequency signal of the second frequency band, only a radio-frequency signal of the first frequency band is propagated, and a third state where the radio-frequency signal of the first frequency band and the radio-frequency signal of the second frequency band are not propagated and a radio-frequency signal of a third frequency band different in frequency band from the first frequency band or the second frequency band is propagated, the switching module comprising:

- a first filter circuit to selectively pass the radio-frequency signal of the first frequency band;
- a second filter circuit to selectively pass the radio-frequency signal of the second frequency band;
- a third filter circuit to selectively pass the radio-frequency signal of the third frequency band; and
- a switch circuit including a common terminal, a first selection terminal connected to one end of the first filter circuit, a second selection terminal connected to one end of the second filter circuit, and a third selection terminal connected to one end of the third filter circuit, the switch circuit being structured to switch connection of at least one of the first selection terminal, the second selection terminal, and the third selection terminal with the common terminal; wherein the first state is a carrier aggregation mode;

in the first state, the common terminal and the first selection terminal are connected, the common terminal and the second selection terminal are connected, and the common terminal and the third selection terminal are not connected;

the second state is a non-carrier aggregation mode;

in the second state, the common terminal and the first selection terminal are connected, the common terminal and the second selection terminal are not connected, and the common terminal and the third selection terminal are connected; and an impedance in the first frequency band when the third filter circuit alone is viewed from the one end of the third filter circuit is equal or substantially equal to an impedance in the first frequency band when the second filter circuit alone is viewed from the one end of the second filter circuit.

* * * * *